United States Patent
Lee et al.

(10) Patent No.: US 12,398,482 B2
(45) Date of Patent: Aug. 26, 2025

(54) DECORATION PANEL FOR HOME APPLIANCES, HOME APPLIANCE INCLUDING THE SAME, AND METHOD FOR MANUFACTURING THE DECORATION PANEL

(71) Applicant: SAMSUNG ELECTRONICS CO., LTD., Suwon-si (KR)

(72) Inventors: Kyunghwan Lee, Suwon-si (KR); Youngdeog Koh, Suwon-si (KR); Kwangjoo Kim, Suwon-si (KR); Jinju Kim, Suwon-si (KR); Jihwan Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 201 days.

(21) Appl. No.: 17/880,083

(22) Filed: Aug. 3, 2022

(65) Prior Publication Data

US 2023/0112067 A1 Apr. 13, 2023

Related U.S. Application Data

(63) Continuation of application No. PCT/KR2022/010197, filed on Jul. 13, 2022.

(30) Foreign Application Priority Data

Oct. 12, 2021 (KR) .......................... 10-2021-0135322
Dec. 31, 2021 (KR) .......................... 10-2021-0193906

(51) Int. Cl.
*C25D 11/04* (2006.01)
*A47B 96/20* (2006.01)
(Continued)

(52) U.S. Cl.
CPC ............. *C25D 11/16* (2013.01); *A47B 96/20* (2013.01); *B44C 1/22* (2013.01); *B44C 1/225* (2013.01);
(Continued)

(58) Field of Classification Search
None
See application file for complete search history.

(56) References Cited

U.S. PATENT DOCUMENTS 2,691,627 A * 10/1954 Johnson ............... C25D 11/022
205/121
4,210,499 A * 7/1980 Hirono ................... C25D 11/14
427/280
(Continued)

FOREIGN PATENT DOCUMENTS

CN 101519016 A * 9/2009
CN 101597784 A * 12/2009
(Continued)

OTHER PUBLICATIONS

Machine Translation of CN102114587A, Jul. 2011 (Year: 2011).*
(Continued)

*Primary Examiner* — Jeffrey A Vonch
(74) *Attorney, Agent, or Firm* — STAAS & HALSEY LLP

(57) ABSTRACT

A decoration panel for home appliances having excellent reflectivity and durability, the decoration panel being applicable to outer sides of various home appliances, a home appliance including the decoration panel, and a method for manufacturing the decoration panel. More specifically, the decoration panel for home appliances includes: an aluminum substrate with one surface in which an engraved pattern having a preset width and a preset depth is formed, the engraved pattern having micro unevenness formed in a
(Continued)

surface of the engraved pattern; a porous aluminum oxide layer formed on the engraved pattern; and a sealing layer formed to close a plurality of pores of the porous aluminum oxide layer, wherein an edge of the aluminum substrate is in a Chamfering (C) shape or a Rounding (R) shape.

13 Claims, 17 Drawing Sheets

(51) Int. Cl.

| | | |
|---|---|---|
| B21C 23/06 | (2006.01) | |
| B23P 15/00 | (2006.01) | |
| B23P 17/00 | (2006.01) | |
| B44C 1/22 | (2006.01) | |
| B44C 5/04 | (2006.01) | |
| B44F 1/02 | (2006.01) | |
| B44F 1/08 | (2006.01) | |
| C25D 11/14 | (2006.01) | |
| C25D 11/16 | (2006.01) | |
| C25D 11/18 | (2006.01) | |
| C25D 11/24 | (2006.01) | |
| A47L 15/42 | (2006.01) | |
| B23P 9/00 | (2006.01) | |
| B23P 13/00 | (2006.01) | |
| C23F 1/02 | (2006.01) | |
| C23F 1/36 | (2006.01) | |
| D06F 39/12 | (2006.01) | |
| D06F 39/14 | (2006.01) | |
| F24C 15/02 | (2006.01) | |
| F24C 15/06 | (2006.01) | |
| F25D 23/00 | (2006.01) | |
| F25D 23/02 | (2006.01) | |

(52) U.S. Cl.
CPC .......... B44C 1/227 (2013.01); B44F 1/02 (2013.01); B44F 1/08 (2013.01); C25D 11/04 (2013.01); C25D 11/14 (2013.01); C25D 11/18 (2013.01); C25D 11/243 (2013.01); C25D 11/246 (2013.01); A47B 2096/208 (2013.01); A47L 15/4251 (2013.01); A47L 15/4265 (2013.01); B21C 23/06 (2013.01); B23P 9/00 (2013.01); B23P 13/00 (2013.01); B23P 15/00 (2013.01); B23P 17/00 (2013.01); B44C 1/221 (2013.01); B44C 5/0415 (2013.01); C23F 1/02 (2013.01); C23F 1/36 (2013.01); D06F 39/12 (2013.01); D06F 39/14 (2013.01); F24C 15/02 (2013.01); F24C 15/06 (2013.01); F25D 23/00 (2013.01); F25D 23/02 (2013.01); F25D 2400/18 (2013.01); Y10T 428/24339 (2015.01); Y10T 428/2457 (2015.01); Y10T 428/24777 (2015.01); Y10T 428/249955 (2015.04); Y10T 428/249976 (2015.04)

(56) References Cited

U.S. PATENT DOCUMENTS

| | | | | |
|---|---|---|---|---|
| 4,375,391 | A * | 3/1983 | Kushida | G04B 37/22 |
| | | | | 205/121 |
| 6,065,820 | A * | 5/2000 | Fleissner | F24C 7/082 |
| | | | | 312/265.5 |
| 6,565,415 | B1 * | 5/2003 | Christiansen | B24B 29/005 |
| | | | | 451/5 |
| 9,034,166 | B2 | 5/2015 | Tatebe et al. | |
| 9,746,765 | B2 | 8/2017 | Choi et al. | |
| 11,394,420 | B2 | 7/2022 | Chun et al. | |
| 2002/0102927 | A1 * | 8/2002 | Lee | C25D 11/16 |
| | | | | 451/28 |
| 2003/0106201 | A1 * | 6/2003 | Holloway | B44F 1/02 |
| | | | | 29/527.2 |
| 2004/0178195 | A1 * | 9/2004 | Kim | F24C 15/08 |
| | | | | 219/756 |
| 2005/0045487 | A1 * | 3/2005 | Kia | C25D 5/50 |
| | | | | 148/688 |
| 2008/0149492 | A1 * | 6/2008 | Lin | C25D 11/243 |
| | | | | 205/229 |
| 2009/0111534 | A1 * | 4/2009 | Lu | H05K 5/0243 |
| | | | | 455/575.1 |
| 2010/0028615 | A1 * | 2/2010 | Hwang | C25D 11/24 |
| | | | | 427/532 |
| 2010/0112298 | A1 * | 5/2010 | Dai | C25D 11/18 |
| | | | | 205/122 |
| 2010/0149530 | A1 * | 6/2010 | Tomaru | C23C 14/5806 |
| | | | | 356/244 |
| 2010/0183869 | A1 * | 7/2010 | Lin | C25D 11/04 |
| | | | | 420/544 |
| 2012/0069500 | A1 * | 3/2012 | Tang | G06F 1/1656 |
| | | | | 361/679.01 |
| 2012/0251779 | A1 * | 10/2012 | Liu | C23C 14/0015 |
| | | | | 428/156 |
| 2013/0081951 | A1 * | 4/2013 | Hankey | B41M 5/262 |
| | | | | 205/208 |
| 2013/0221816 | A1 * | 8/2013 | Liou | C25D 11/246 |
| | | | | 205/333 |
| 2013/0280122 | A1 * | 10/2013 | Asano | B21B 1/26 |
| | | | | 72/200 |
| 2013/0319865 | A1 * | 12/2013 | Browning | B23P 17/00 |
| | | | | 205/171 |
| 2013/0322976 | A1 * | 12/2013 | Tan | C25D 11/022 |
| | | | | 409/131 |
| 2014/0027290 | A1 * | 1/2014 | Giovanardi | B44D 5/00 |
| | | | | 205/52 |
| 2014/0246323 | A1 * | 9/2014 | Porter | C25D 11/24 |
| | | | | 205/208 |
| 2014/0367369 | A1 * | 12/2014 | Nashner | B23K 26/361 |
| | | | | 451/38 |
| 2016/0265117 | A1 * | 9/2016 | Maloney | B44C 1/228 |
| 2018/0066374 | A1 * | 3/2018 | Le | C25D 11/16 |
| 2018/0094819 | A1 * | 4/2018 | Heo | F24C 15/06 |
| 2018/0237936 | A1 * | 8/2018 | Curran | C25D 11/08 |
| 2018/0305837 | A1 * | 10/2018 | Xiong | C23F 1/20 |
| 2018/0305838 | A1 * | 10/2018 | Xiong | C25D 11/18 |
| 2018/0310425 | A1 * | 10/2018 | Liao | C25D 11/12 |
| 2019/0062885 | A1 * | 2/2019 | Prasannavenkatesan | |
| | | | | C23F 1/00 |
| 2020/0080219 | A1 | 3/2020 | Curran et al. | |
| 2020/0101696 | A1 * | 4/2020 | Curran | C25D 11/14 |
| 2020/0113332 | A1 * | 4/2020 | Jeong | E06B 5/006 |
| 2020/0299811 | A1 * | 9/2020 | Seki | C25D 11/04 |
| 2021/0164111 | A1 * | 6/2021 | Lee | C25D 11/16 |
| 2022/0007533 | A1 * | 1/2022 | Wu | C25D 13/04 |
| 2022/0139677 | A1 * | 5/2022 | Peng | C23C 4/02 |
| | | | | 156/345.51 |
| 2022/0162766 | A1 * | 5/2022 | Wu | C25D 11/30 |
| 2022/0408582 | A1 * | 12/2022 | Son | B23H 3/00 |
| 2024/0191932 | A1 * | 6/2024 | Lee | C25D 11/04 |

FOREIGN PATENT DOCUMENTS

| | | | | | |
|---|---|---|---|---|---|
| CN | 102071447 | A | * | 5/2011 | |
| CN | 102114587 | A | * | 7/2011 | |
| CN | 102170763 | A | * | 8/2011 | |
| CN | 102189888 | A | * | 9/2011 | ............ C25D 11/16 |
| CN | 102480533 | A | * | 5/2012 | |
| CN | 102654782 | A | * | 9/2012 | |
| CN | 102689559 | A | * | 9/2012 | |
| CN | 102691085 | A | * | 9/2012 | |
| CN | 103072236 | A | * | 5/2013 | |
| CN | 103157963 | A | * | 6/2013 | |
| CN | 103313520 | A | * | 9/2013 | |
| CN | 203221215 | U | * | 10/2013 | |
| CN | 103397363 | A | * | 11/2013 | |
| CN | 104117572 | A | * | 10/2014 | |

(56) References Cited

FOREIGN PATENT DOCUMENTS

| CN | 104148687 | A | * | 11/2014 | ............ B23B 27/02 |
| CN | 203944897 | U | * | 11/2014 | |
| CN | 104278309 | A | * | 1/2015 | ............ C25D 11/12 |
| CN | 104551182 | A | * | 4/2015 | ............ B23C 3/00 |
| CN | 104695004 | A | * | 6/2015 | |
| CN | 104723035 | A | * | 6/2015 | |
| CN | 104786007 | A | * | 7/2015 | ............ B23P 15/00 |
| CN | 104805485 | A | * | 7/2015 | |
| CN | 105072859 | A | * | 11/2015 | |
| CN | 105149624 | A | * | 12/2015 | ............ B23B 27/00 |
| CN | 105177669 | A | * | 12/2015 | |
| CN | 105499917 | A | * | 4/2016 | |
| CN | 205142297 | U | * | 4/2016 | |
| CN | 105543928 | A | * | 5/2016 | |
| CN | 105642927 | A | * | 6/2016 | |
| CN | 105671615 | A | * | 6/2016 | |
| CN | 105946424 | A | * | 9/2016 | |
| CN | 106077829 | A | * | 11/2016 | |
| CN | 106112384 | A | * | 11/2016 | |
| CN | 106141563 | A | * | 11/2016 | |
| CN | 106240215 | A | * | 12/2016 | |
| CN | 106378479 | A | * | 2/2017 | |
| CN | 106435687 | A | * | 2/2017 | ............ C25D 11/08 |
| CN | 106637335 | A | * | 5/2017 | |
| CN | 106735321 | A | * | 5/2017 | |
| CN | 107065767 | A | * | 8/2017 | ............ G05B 19/19 |
| CN | 107263017 | A | * | 10/2017 | |
| CN | 107396558 | A | * | 11/2017 | ........... B23K 26/361 |
| CN | 107717638 | A | * | 2/2018 | |
| CN | 107825071 | A | * | 3/2018 | ............ B23P 15/00 |
| CN | 108422021 | A | * | 8/2018 | ............ B23C 5/00 |
| CN | 108480934 | A | * | 9/2018 | |
| CN | 108560034 | A | * | 9/2018 | ............... C23F 3/03 |
| CN | 108637597 | A | * | 10/2018 | ............ B23P 15/00 |
| CN | 108942401 | A | * | 12/2018 | ........... B23Q 15/007 |
| CN | 109161607 | A | * | 4/2019 | |
| CN | 109940342 | A | * | 6/2019 | |
| CN | 111155156 | A | * | 5/2020 | |
| CN | 111989501 | A | * | 11/2020 | ............ B23C 3/00 |
| CN | 112312688 | A | * | 2/2021 | |
| CN | 113511024 | A | * | 10/2021 | ............ B44B 1/006 |
| DE | 4412546 | A1 | * | 10/1995 | ............ A47L 15/42 |
| DE | 19860137 | A1 | * | 6/2000 | ............ B05D 5/08 |
| DE | 102009046998 | A1 | * | 5/2011 | ............ F24C 7/082 |
| EP | 1160513 | A2 | * | 12/2001 | ............ F24C 7/082 |
| EP | 2594342 | A1 | * | 5/2013 | ............ B05D 5/06 |
| EP | 3 249 494 | A1 | | 11/2017 | |
| JP | 08047848 | A | * | 2/1996 | |
| JP | 09143795 | A | * | 6/1997 | |
| JP | 10-121292 | | | 5/1998 | |
| JP | 2003011037 | A | * | 1/2003 | |
| JP | 2004091844 | A | * | 3/2004 | |
| JP | 2012-136749 | | | 7/2012 | |
| JP | 2014-58744 | | | 4/2014 | |
| JP | 2018-168464 | | | 11/2018 | |
| KR | 2002007812 | A | * | 1/2002 | |
| KR | 20-0288842 | Y1 | | 9/2002 | |
| KR | 10-0358847 | B1 | | 10/2002 | |
| KR | 2005004083 | A | * | 1/2005 | ............ C25D 11/04 |
| KR | 2005029089 | A | * | 3/2005 | |
| KR | 2006060360 | A | * | 6/2006 | ............... B44C 1/22 |
| KR | 2009046493 | A | * | 5/2009 | ............... C23F 1/00 |
| KR | 2010032957 | A | * | 3/2010 | |
| KR | 10-2010-0085704 | | | 7/2010 | |
| KR | 2010085704 | A | * | 7/2010 | |
| KR | 2010088005 | A | * | 8/2010 | ............ B23D 79/00 |
| KR | 10-2015-0053473 | | | 5/2015 | |
| KR | 1798641 | B1 | * | 11/2017 | ............ B24C 1/086 |
| KR | 10-1872436 | B1 | | 7/2018 | |
| KR | 2095158 | B1 | * | 3/2020 | ............ A45D 33/18 |
| KR | 10-2020-0052215 | | | 5/2020 | |
| RU | 2483860 | C2 | * | 6/2013 | |
| WO | WO-2009068168 | A1 | * | 6/2009 | ............ C25D 11/18 |
| WO | WO-2013099935 | A1 | * | 7/2013 | ............... B24C 1/04 |
| WO | WO-2015021582 | A1 | * | 2/2015 | ............ C23C 28/00 |
| WO | WO-2020096355 | A1 | * | 5/2020 | ........... G06F 1/1626 |

OTHER PUBLICATIONS

Machine Translation of CN106077829A, Nov. 2016 (Year: 2016).*
Machine Translation of CN-106378479-A, Feb. 2017 (Year: 2017).*
Machine Translation of CN-106735321-A, May 2017 (Year: 2017).*
Machine Translation of KR-2010032957-A, Mar. 2010 (Year: 2010).*
Machine Translation of KR200288842Y1, Sep. 2002 (Year: 2002).*
Machine Translation of CN-108480934-A, Sep. 2018 (Year: 2018).*
Timesavers, Edge Rounding Machine for Safety and Surface Treatments, Mar. 2021 (Year: 2021).*
International Search Report dated Nov. 2, 2022 in International Patent Application No. PCT/KR2022/010197 (3 pages; 4 pages English translation).
PCT/ISA/237 dated Nov. 2, 2022 in International Patent Application No. PCT/KR2022/010197 (5 pages).
Supplemental Partial European Search Report dated Feb. 19, 2025 issued in European Application No. EP 22 88 1167.
Supplemental European Search Report dated May 13, 2025 issued in European Application No. EP 22 88 1167.

* cited by examiner

FORM DENSE SEALING LAYER
(NO PORES OBSERVED)

PLURALITY OF OPEN PORES OBSERVED

DECORATION PANEL FOR HOME APPLIANCES, HOME APPLIANCE INCLUDING THE SAME, AND METHOD FOR MANUFACTURING THE DECORATION PANEL

CROSS-REFERENCE TO RELATED APPLICATION

This application is a continuation application, under 35 U.S.C. § 111(a), of International Patent Application No. PCT/KR2022/010197, filed on Jul. 13, 2022, which claims priority under 35 U.S.C. § 119 to Korean Patent Applications No. 10-2021-0135322, filed on Oct. 12, 2021, and No. 10-2021-0193906, filed on Dec. 31, 2021 in the Korean Intellectual Property Office, the disclosures of which are incorporated by reference herein in their entireties.

BACKGROUND

1. Field

The disclosure relates to a decoration panel for home appliances with excellent reflectivity, a method for manufacturing the decoration panel, and a refrigerator including the decoration panel.

2. Description of the Related Art

Recently, decoration panels that are applied to home appliances, such as a refrigerator, a washing machine, a dishwasher, an oven, a hood, etc., are manufactured with metallic texture in order to give an aesthetic effect. Generally, a decoration panel is formed by forming a metal layer and a coating layer on the upper surface of a base layer.

Meanwhile, a method of forming an engraved pattern in a rear surface to increase reflectivity is well known. For example, Korean Registered Utility Model No. 20-0288842 relates to a light guide plate including a light reflective structure of an engraved pattern, and discloses a method of reflecting light to the front surface by machining an engraved pattern in the rear surface of the light guide plate using a transparent material.

However, because the light guide plate needs to be made with a transparent material, only a plastic material and a glass material are used for the light guide plate. Also, because an engraved pattern needs to be implemented in the rear surface of the material by machining, fine unevenness is formed in a machined area where a machining tool is applied, resulting in a decrease in transparency. Also, it is impossible to form micro-scaled unevenness by machining, and even though micro-scaled unevenness is implemented by a physical method, the light guide plate has significantly low transparency to become opaque, which causes a deterioration of quality in outer appearance of the product.

SUMMARY

Therefore, it is an aspect of the disclosure to provide a decoration panel for home appliances having excellent reflectivity to increase metallic texture of an aluminum material, while improving durability to improve scratch resistance, dent resistance, discoloration prevention, and easy cleaning, a method for manufacturing the decoration panel, and a refrigerator to which the decoration panel is applied.

Additional aspects of the disclosure will be set forth in part in the description which follows and, in part, will be obvious from the description, or may be learned by practice of the disclosure.

A decoration panel for home appliances, according to an embodiment of the disclosure, includes: an aluminum substrate with one surface in which an engraved pattern having a preset width and a preset depth is formed, the engraved pattern having micro unevenness formed in a surface of the engraved pattern; a porous aluminum oxide layer formed on the engraved pattern; and a sealing layer formed to close a plurality of pores of the porous aluminum oxide layer, wherein an edge of the aluminum substrate is in a Chamfering (C) shape or a Rounding (R) shape.

Also, the preset width of the engraved pattern may range from 3.0 mm to 10.0 mm.

Also, the preset depth of the engraved pattern may range from 75 µm to 860 µm.

Also, a gradient of the engraved pattern may range from 120° to 170°.

Also, the edge of the aluminum substrate may be formed in the C shape ranging from 0.5 C to 2.0 C.

Also, the edge of the aluminum substrate may be formed in the R shape ranging from 0.5 R to 2.0 R.

Also, a thickness of the porous aluminum oxide layer may range from 5.0 µm to 30.0 µm.

Also, each pore of the porous aluminum oxide layer may be formed with a size ranging from 10 nm to 100 nm.

Also, the porous aluminum oxide layer may further include a dye filled in the plurality of pores.

Also, the sealing layer may be formed of a plurality of aluminum oxide particles.

A method for manufacturing a decoration panel, according to another embodiment of the disclosure, includes: preparing an aluminum substrate; forming an engraved pattern in one surface of the aluminum substrate; forming micro unevenness in a surface of the engraved pattern; performing anodizing on the surface of the aluminum substrate in which the micro unevenness is formed to form a porous aluminum oxide layer; and performing sealing to close a plurality of pores of the porous aluminum oxide layer.

Also, the forming of the engraved pattern may be performed through extrusion molding or Computer Numerical Control (CNC) machining.

Also, the forming of the micro unevenness may be performed by at least one process selected from chemical etching and sand blasting, wherein the chemical etching may be performed by using an etching solution selected from a group including $NaNO_3$, $H_2O_2$, NaOH, and combinations thereof, and the sand blasting may be performed by using an abrasive selected from among stainless steel, ceramic, glass, and emery.

Also, the method may further include machining an edge of the aluminum substrate to a Chamfering (C) shape or a Rounding (R) shape after the forming of the engraved pattern.

Also, the method may further include coloring with a dye for color implementation, before the performing of the sealing.

A home appliance according to another embodiment of the disclosure may include an outer body manufactured by using the decoration panel for home appliances according to an embodiment of the disclosure.

A home appliance according to another embodiment of the disclosure includes: a main body; and a door to open or close the main body, at least one of the main body or the door is formed with an aluminum decoration panel, wherein the aluminum decoration panel includes: an aluminum substrate with one surface in which an engraved pattern having a preset width and a preset depth is formed, the engraved pattern having micro unevenness formed in a surface of the engraved pattern; a porous aluminum oxide layer formed on the engraved pattern; and a sealing layer formed to close a plurality of pores of the porous aluminum oxide layer.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
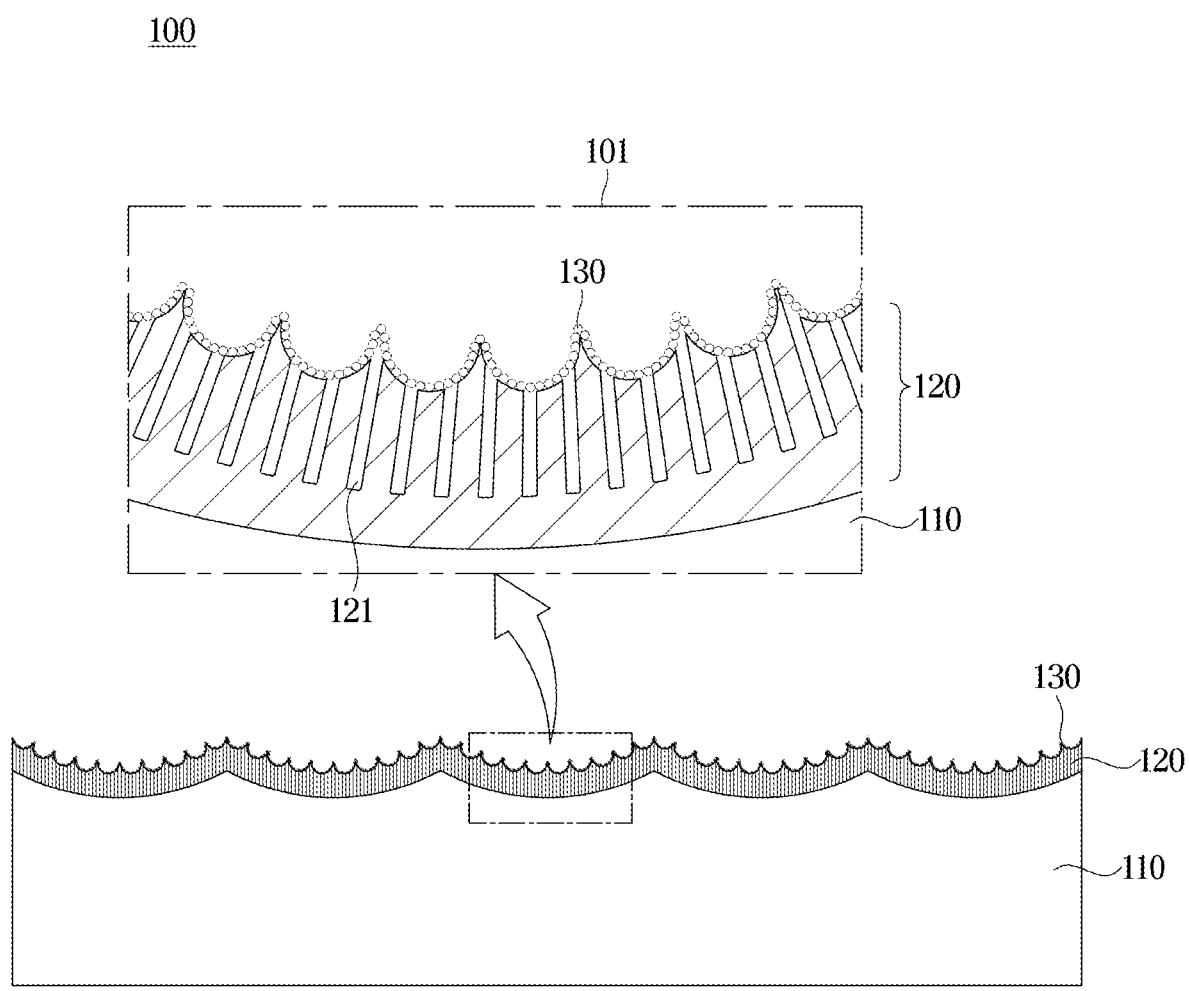
FIG. 1 is a cross-sectional view showing a structure of a decoration panel for home appliances according to an embodiment of the disclosure, and an enlarged view of an engraved pattern.

Hereinafter, embodiments of the disclosure will be described. However, the embodiments of the disclosure may be modified in various different forms, and the technical concept of the disclosure is not limited to the embodiments which will be described below. Also, the embodiments of the disclosure are provided to more completely describe the disclosure for persons having ordinary skill in the related technical field.

It will be understood that when the terms "includes," "comprises," "including," and/or "comprising," when used in this specification, specify the presence of stated features, operations, functions, components, or combinations thereof, but do not preliminarily preclude the presence or addition of other features, operations, functions, components, or combinations thereof.

In the entire specification, it will also be understood that when an element is referred to as being "on" or "over" another element, it can be directly on the other element or intervening elements may also be present.

Also, the terms "first" and "second" are used to distinguish one component from another, and components should not be limited by these terms.

Unless otherwise defined, all terms used in this specification have the same meaning as those generally understood by those of ordinary skill in the technical field to which the disclosure belongs. Accordingly, unless clearly defined in this application, they will not be understood as ideological or overly formal meanings. It is to be understood that the singular forms "a," "an," and "the" in this specification include plural referents unless the context clearly dictates otherwise.

As used in the specification, the terms "about", "substantially", or the like, which represents a degree, are used as meanings at numerical values or approaching the numerical values when inherent tolerances of preparation and material are presented to the abovementioned meanings, and they are used to prevent unconscientious invaders from unfairly using the contents in which accurate or absolute numerical values are disclosed in order to help the understandings of the disclosure.

Reference numerals used in operations are used for convenience of description, without describing the order of the operations, and the operations can be executed in a different order from the stated order unless a specific order is definitely specified in the context.

Throughout the disclosure, the expression "at least one of a, b or c" indicates 'only a', 'only b', 'only c', 'both a and b', 'both a and c', 'both b and c', 'all of a, b, and c', or variations thereof.

Hereinafter, an operation principle and embodiments of the disclosure will be described with reference to the accompanying drawings.

FIG. 1 is a cross-sectional view showing a structure of a decoration panel 100 for home appliances according to an embodiment of the disclosure, and an enlarged view of a surface 101 of an engraved pattern.

Referring to FIG. 1, a decoration panel 100 for home appliances may include: an aluminum substrate 110 having one surface in which an engraved pattern is formed;

a porous aluminum oxide layer 120 formed on the engraved pattern; and a sealing layer 130 formed to close a plurality of pores 121 of the porous aluminum oxide layer 120.

As the aluminum substrate 110, any aluminum material to which an anodizing process is applicable may be used without limitation, and the aluminum material may include aluminum ranging from, for example, Al 1000 series to Al 7000 series.

Figure 2:
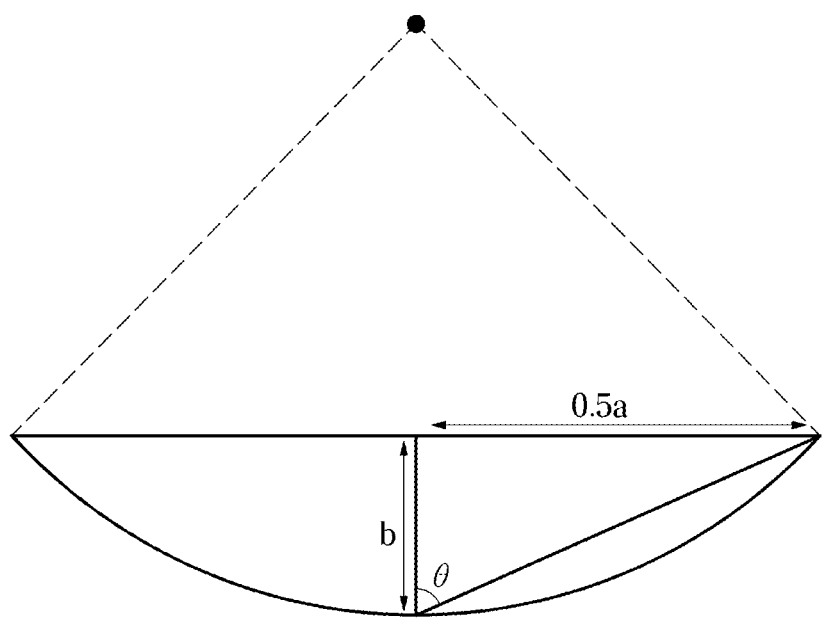
FIG. 2 shows a width a, depth b, and gradient 2θ of an engraved pattern formed in one surface of a decoration panel for home appliances according to an embodiment of the disclosure.

The engraved pattern formed in one surface of the aluminum substrate 110 may have a preset width, a preset depth, and a preset gradient as shown in FIG. 2. For example, a width a of the engraved pattern may range from 3.0 mm to 10.0 mm, a depth b of the engraved pattern may range from 75 μm to 860 μm, and a gradient 2θ of the engraved pattern may range from 120° to 170°. For examples, the width a, depth b, and gradient 2θ of the engraved pattern may have values shown in Table 1 below.

TABLE 1

| Width a (mm) | 3 | 4 | 5 | 6 | 7 | 8 | 9 | 10 |
|---|---|---|---|---|---|---|---|---|
| Depth b (μm) | 75 | 134 | 215 | 303 | 414 | 543 | 689 | 853 |
| Gradient 2θ (°) | 170 | 165 | 158 | 152 | 145 | 137 | 129 | 120 |

Figure 6A:
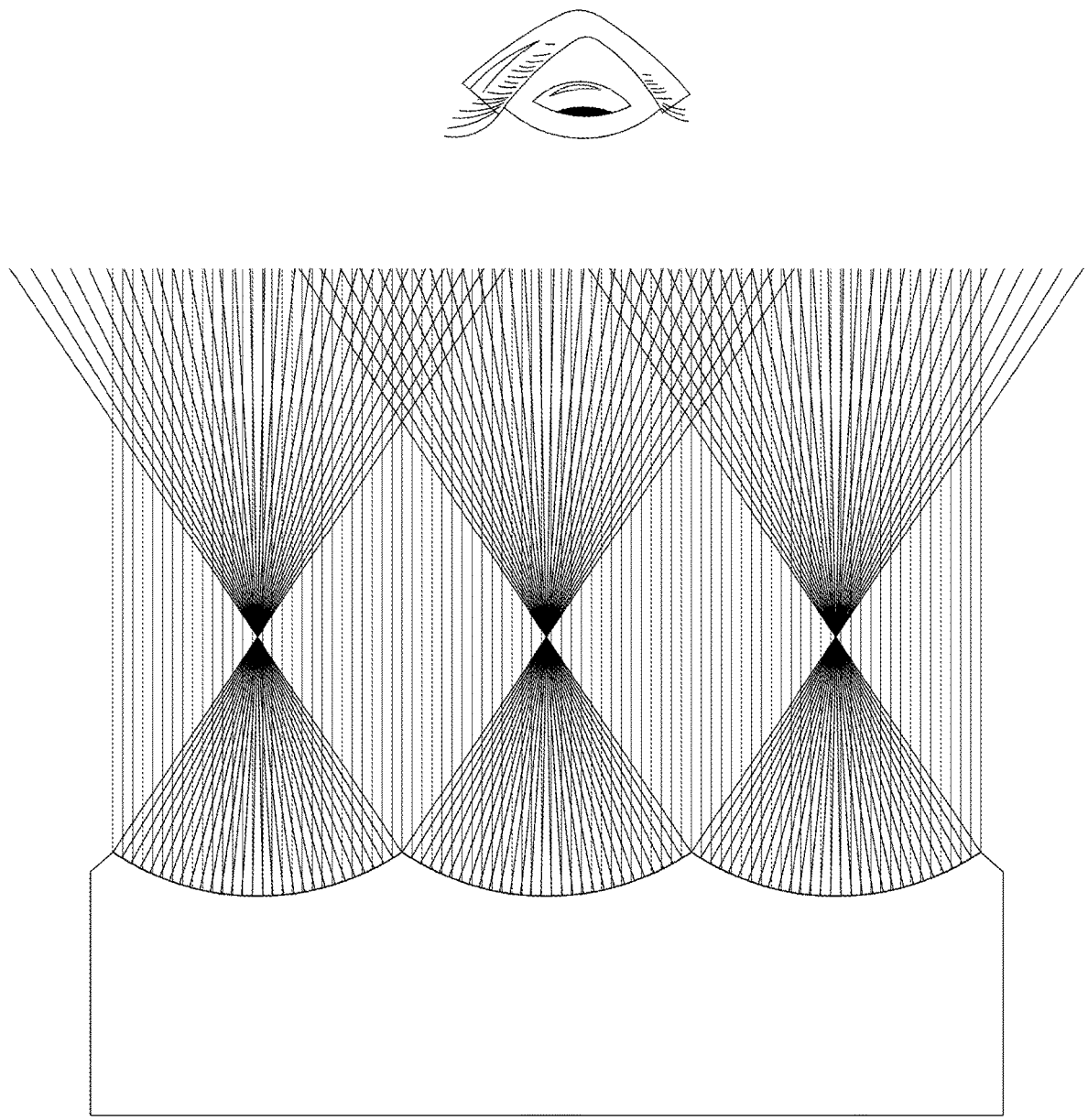
FIG. 6A is a schematic diagram showing linear density of reflected light according to incident light in a decoration panel in which an engraved pattern according to an embodiment of the disclosure is formed.
Figure 6B:
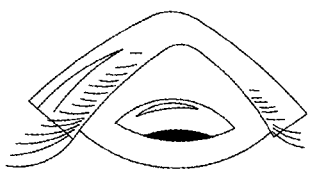
FIG. 6B is a schematic diagram showing linear density of reflected light according to incident light in a flat panel according to a comparative example.
Figure 6B:
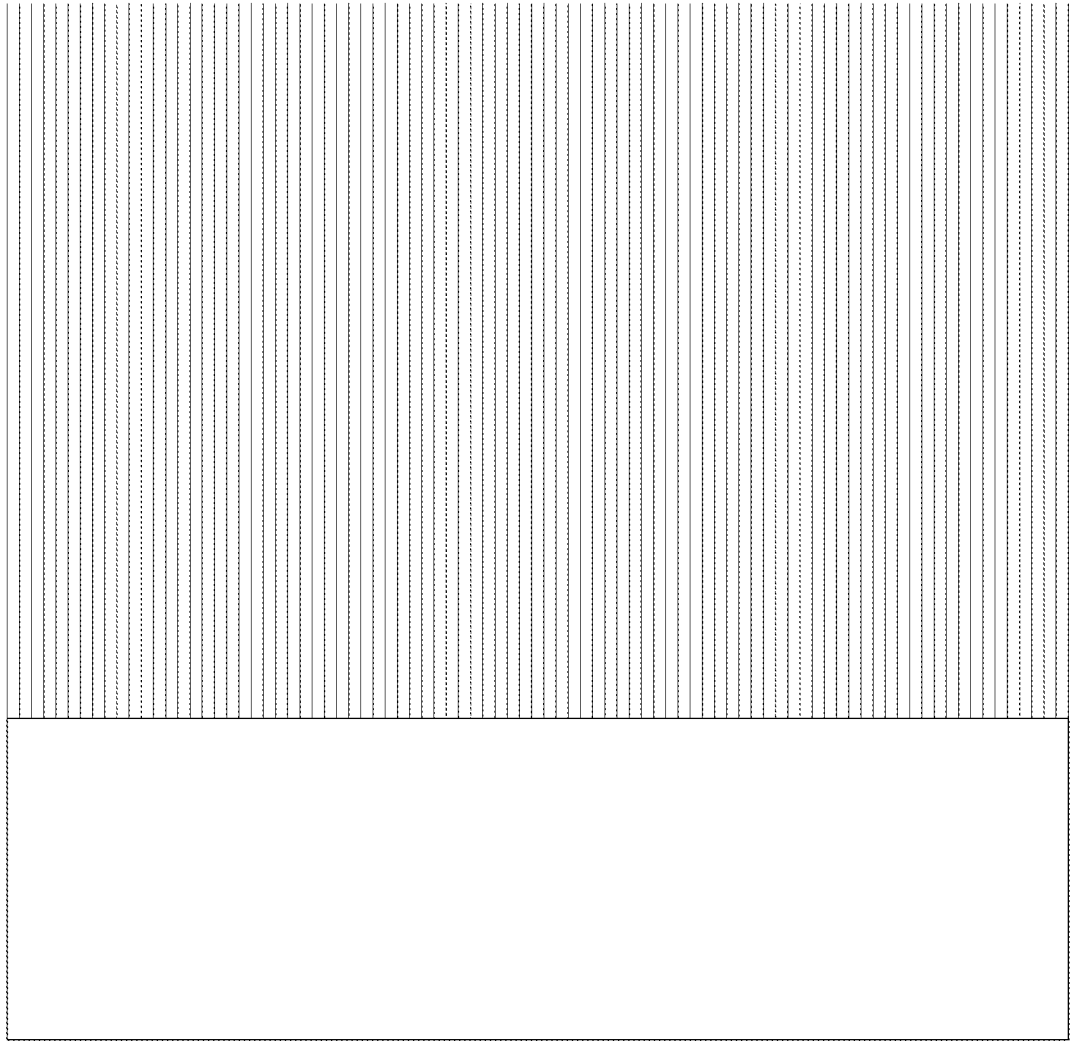

FIG. 6A is a schematic diagram showing linear density of reflected light according to incident light in a decoration panel in which an engraved pattern according to an embodiment of the disclosure is formed, and FIG. 6B is a schematic diagram showing linear density of reflected light according to incident light in an existing flat panel.

Referring to FIG. 6A, in a case in which an engraved pattern is formed, light entering from the front may be reflected to increase linear density, and accordingly, reflectivity may be improved compared to a case of a flat surface. Also, in a case in which the decoration panel in which the engraved pattern is formed is seen from the front, shadows may be formed by ridges of the engraved pattern to improve a sense of three-dimensions, and differences between amounts of reflection of light may be made according to angles at which a user sees the decoration panel to thereby express various colors.

Figure 5A:
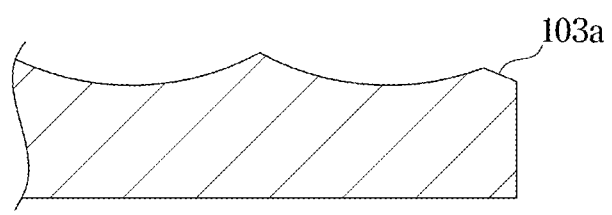
FIG. 5A is a cross-sectional view showing a C-shaped edge of a decoration panel for home appliances according to an embodiment of the disclosure.
Figure 5B:
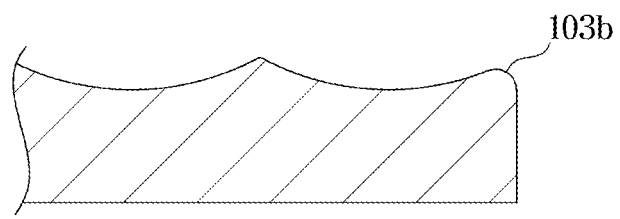
FIG. 5B is a cross-sectional view showing an R-shaped edge of a decoration panel for home appliances according to an embodiment of the disclosure.

Also, the aluminum substrate 110 may have a Chamfering (C)-shaped edge or a Rounding (R)-shaped edge. FIG. 5A is a cross-sectional view showing a C-shaped edge 103a, and FIG. 5B is a cross-sectional view showing an R-shaped edge 103b.

According to an embodiment of the disclosure, the C-shaped edge may be formed in a range of 0.5 C to 2.0 C, and the R-shaped edge may be formed in a range of 0.5 R to 2.0 R. "0.5 R to 2.0 R" means a radius of curvature with a radius of 0.5 mm to 2 mm, and "0.5 C to 2.0 C" means a 45° chamfer with a side length of 0.5 mm to 2 mm. The ranges may be set to achieve an excellent visual effect of the decoration panel seen from the side while preventing safety accidents that may be caused by sharp edges.

Also, in the aluminum substrate 110 having one surface in which the engraved pattern is formed, micro unevenness may be formed in the surface 101 of the engraved pattern. By forming the micro unevenness in the surface 101 of the engraved pattern, an effect of dispersing incident light to various angles may be provided to widen a reflection angle of light to a greater range. Thereby, high reflectivity may be achieved, and metallic texture may increase.

The porous aluminum oxide layer 120 may be formed by oxidizing a surface of the aluminum substrate 110 through an anodizing process. The porous aluminum oxide layer 120 may include a plurality of pores 121 and improve durability of the decoration panel.

A thickness of the porous aluminum oxide layer 120 may be 5.0 μm or more, preferably, from 5.0 μm to 30.0 μm. Also, each of the plurality of pores 121 may have a size ranging from 10 nm to 100 nm. The pores 121 having the size range may allow infiltration of a dye with high adhesion.

Also, the pores 121 of the porous aluminum oxide layer 120 may be filled with a dye to express a color of the decoration panel. By coloring the pores 121 with the dye, a desired color may be implemented.

The sealing layer 130, which is a ceramic layer formed of a plurality of aluminum oxide ($AL_2O_3$) particles, may be formed to close the pores 121 of the porous aluminum oxide layer 120. The sealing layer 130 may prevent scratches or dents that may be made in a user's life, due to excellent surface hardness of aluminum oxide, and, because the sealing layer 130 is formed by densely applying the plurality of aluminum oxide ($Al_2O_3$) particles, an effect of preventing discoloration and enabling easy removal of foreign materials may also be obtained.

Also, the sealing layer 130 may prevent the dye filled in the pores 121 of the porous aluminum oxide layer 120 from being discolored.

Figure 3:
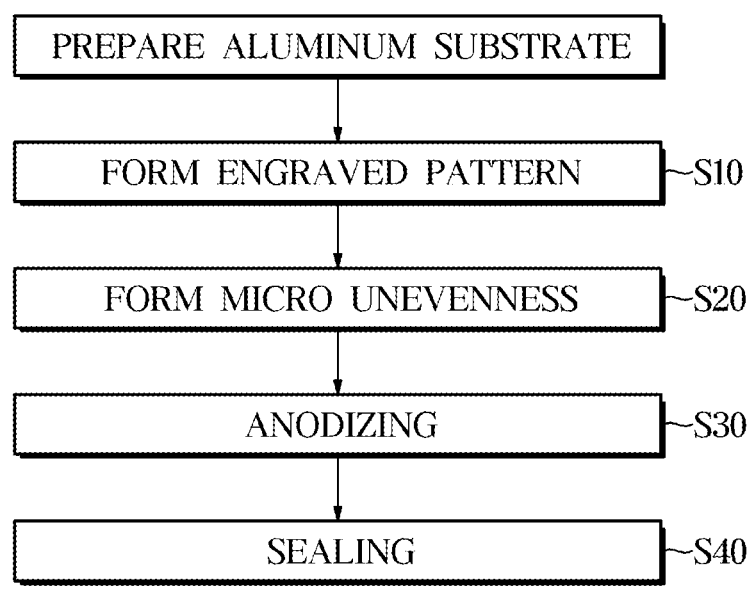
FIG. 3 is a process flowchart showing a method for manufacturing a decoration panel for home appliances according to an embodiment of the disclosure.
Figure 4:
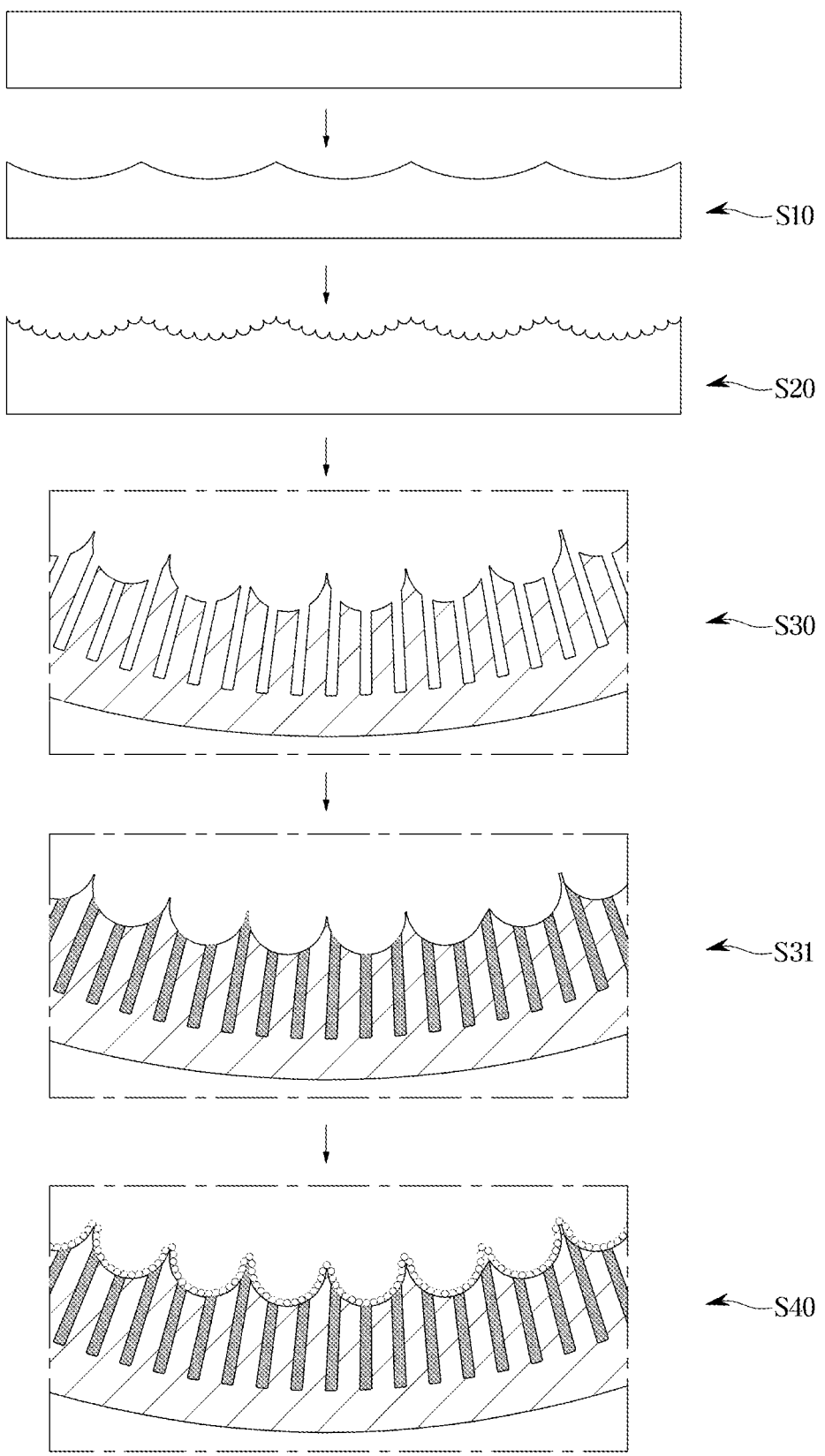
FIG. 4 is a process flowchart showing a method for manufacturing a decoration panel for home appliances according to an embodiment of the disclosure.

FIGS. 3 and 4 are process flowcharts showing a method for manufacturing a decoration panel for home appliances according to an embodiment of the disclosure.

Referring to FIG. 3, a method for manufacturing a decoration panel for home appliances, according to an embodiment of the disclosure, may include: preparing an aluminum substrate; forming an engraved pattern (operation S10), forming micro unevenness (operation S20); anodizing (operation S30); and sealing (operation S40).

As the aluminum substrate 110, any aluminum material to which an anodizing process is applicable may be used without limitation, and the aluminum material may include aluminum ranging from Al 1000 series to Al 7000 series.

Operation S10 of forming the engraved pattern may be to form an engraved pattern in one surface of the aluminum substrate, and may be performed by extrusion molding or Computer Numerical Control (CNC) machining. According to an embodiment of the disclosure, a desired engraved pattern may be implemented in a surface of an aluminum material by performing extrusion molding with the aluminum material, or in a case of a shape having difficulties in extrusion or a large substrate, an engraved pattern may be implemented by performing CNC machining directly on a prepared aluminum substrate or a three-dimensional component.

According to an embodiment of the disclosure, the engraved pattern formed in the surface of the aluminum substrate may have a width a ranging from 3.0 mm to 10.0 mm, a depth b ranging from 75 μm to 860 μm, and a gradient 2θ ranging from 120° to 170°.

Also, after the engraved pattern is formed, operation of machining an edge of the aluminum substrate to a C shape or an R shape may be further performed. Operation of machining the edge of the aluminum substrate may be performed through Computer Numerical Control (CNC) machining. According to an embodiment of the disclosure, the C shape may be machined to a range of, preferably, 0.5 C to 2.0 C, and the R shape may be machined to a range of, preferably, 0.5 R to 2.0 R. "0.5 R to 2.0 R" means a radius of curvature with a radius of 0.5 mm to 2 mm, and "0.5 C to 2.0 C" means a 45° chamfer with a side length of 0.5 mm to 2 mm.

Operation S20 of forming micro unevenness may be to form micro unevenness in the surface of the engraved surface. Operation S20 may be performed through at least one process selected from chemical etching and sand blasting, and, in view of forming finer micro unevenness, it may be more preferable to form micro unevenness through a chemical etching process. By chemically forming micro unevenness in the engraved pattern, an effect of widening a reflection angle of light to a greater range may be obtained.

For example, the chemical etching process may be performed with an etching solution selected from a group including $NaNO_3$, $H_2O_2$, NaOH, and combinations thereof.

According to an embodiment of the disclosure, the chemical etching process may include soaking the aluminum substrate in which the engraved pattern is formed in a sodium nitrate ($NaNO_3$) solution of 1 wt % to 5 wt % in a temperature range of 50° C. to 60° C. for 0.5 minutes to 10 minutes, wherein hydrogen peroxide ($H_2O_2$) of 3.0 wt % to 7.0 wt % may be further added to improve etching activity.

According to another embodiment of the disclosure, the chemical etching process may include soaking the aluminum substrate in which the engraved pattern is formed in a sodium hydroxide (NaOH) solution of 1 wt % to 5 wt % in a temperature range of 50° C. to 60° C. for 0.5 minutes to 2.0 minutes.

For example, the sand blasting process may be performed with any one abrasive selected from among stainless steel, ceramic, glass, and emery, and the sand blasting process may use an abrasive having a diameter of, preferably, 30 μm to 500 μm.

Operation S30 of anodizing may be to form a porous aluminum oxide layer on a surface of the engraved pattern of the aluminum substrate in which micro unevenness is formed.

Anodizing may be an electrochemical process of soaking metal such as aluminum in a liquid electrolyte and then applying current by using the metal as an anode electrode and a counter electrode as a cathode electrode to form an even-textured, thick oxide film on a surface of the metal.

An anode electrode may be an electrode in which an oxidation reaction occurs and which is opposite to a cathode electrode in which a reduction reaction occurs. Oxidation may be chemical bonding of a metal element with oxygen. Accordingly, electrochemically growing a thin oxide layer by using an oxidation reaction occurring on the surface of metal as an anode electrode soaked in a solution is called anodic oxidation, that is, anodizing.

Most of metal exists as oxide in the natural world. That is, a stable phase in the natural world is oxide, and metal is in a metastable phase, not in the stable phase.

To change a metastable state of metal to a stable phase, the surface of the metal may need to be naturally covered with a protective oxide film. That is, a reason of stably using metal such as aluminum having high reactivity in the atmosphere is because a native oxide film formed on the metal surface protects the metal.

Generally, corrosion resistance of metal depends on densification and chemical stability of a native oxide film formed on the metal surface. Anodic oxidation is an electrochemical process for artificially growing the thickness of a surface oxide film to protect metal in the case in which sufficient corrosion resistance is not obtained due to a thin thickness of a native oxide film.

According to an embodiment of the disclosure, by performing an anodizing process under a condition of a voltage range of 13 V to 17 V and a temperature range of 18° C. to 23° C., the porous aluminum oxide layer 120 may be formed to a thickness of 5.0 μm or more.

Also, referring to FIG. 4, before operation S40 of sealing, operation S31 of coloring with a dye to implement a color may be further performed.

In operation S31 of coloring with the dye, the dye may be filled in the pores 121 of the porous aluminum oxide layer 120 to implement a color of the substrate, wherein the dye is any kind of dye commonly used to implement a color of metal.

Operation S40 of sealing may be to form a sealing layer for closing the pores 121 of the porous aluminum oxide layer 120, wherein the sealing layer may be a ceramic layer formed of a plurality of aluminum oxide ($Al_2O_3$) particles. By forming the sealing layer with a plurality of aluminum oxide particles, the sealing layer may have excellent surface hardness, resulting in an improvement of durability including scratch resistance, dent resistance, discoloration resistance, and contamination resistance.

According to an embodiment of the disclosure, the sealing process may include sealing with nickel acetate powder of 3 wt % to 4 wt % at temperature of 80° C. to 90° C. for 10 minutes or more. A sealing process that does not satisfy the above-described condition may result in a sparse sealing layer.

According to an embodiment of the disclosure, as shown in FIG. 4, a dye may be filled in the pores 121 of the porous aluminum oxide layer 120. In this case, by forming the sealing layer, openings of the pores 121 in which the dye is filled may be closed, thereby preventing the dye from being discolored.

The decoration panel for home appliances according to an embodiment of the disclosure may be used for outer bodies of various kinds of commonly known home appliances without limitation. Examples of the home appliances may be a refrigerator, a dishwasher, an oven, a hood, an air purifier, a styler, etc.

A home appliance according to an embodiment of the disclosure may include an outer body using the decoration panel for home appliances.

Figure 10:
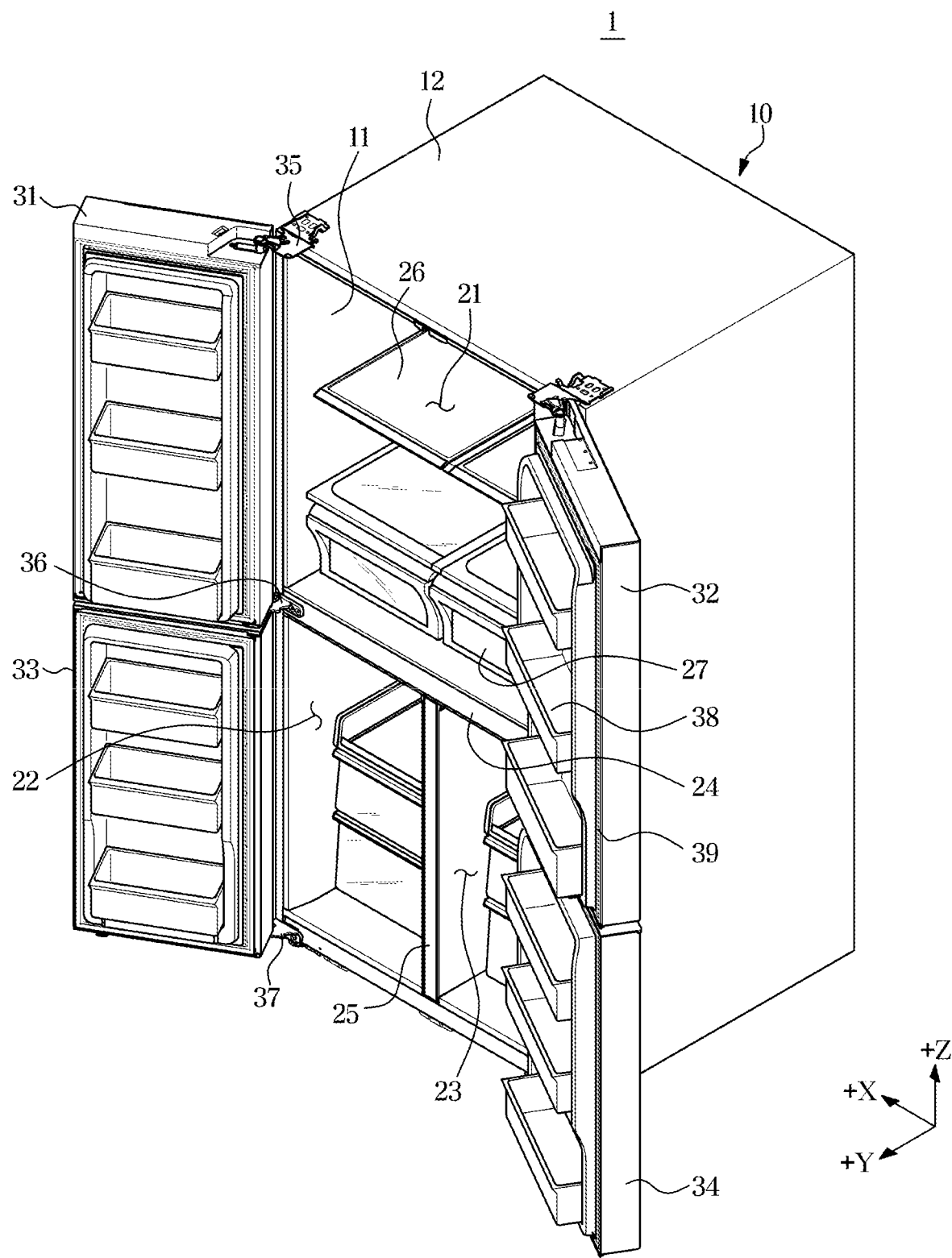
FIG. 10 shows a structure of a refrigerator according to an embodiment of the disclosure.
Figure 11:
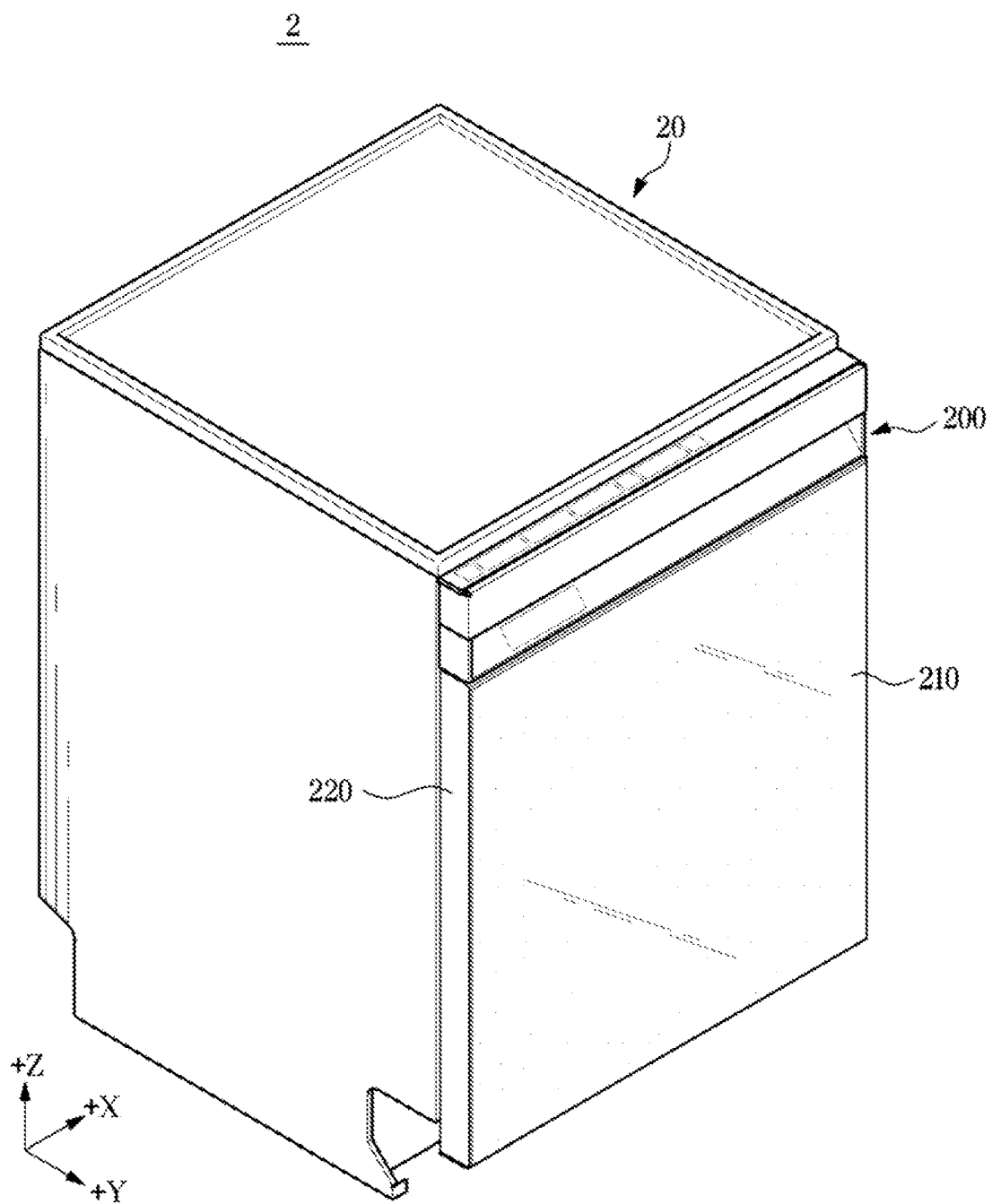
FIG. 11 shows an outer appearance of a dishwasher according to an embodiment of the disclosure.
Figure 12:
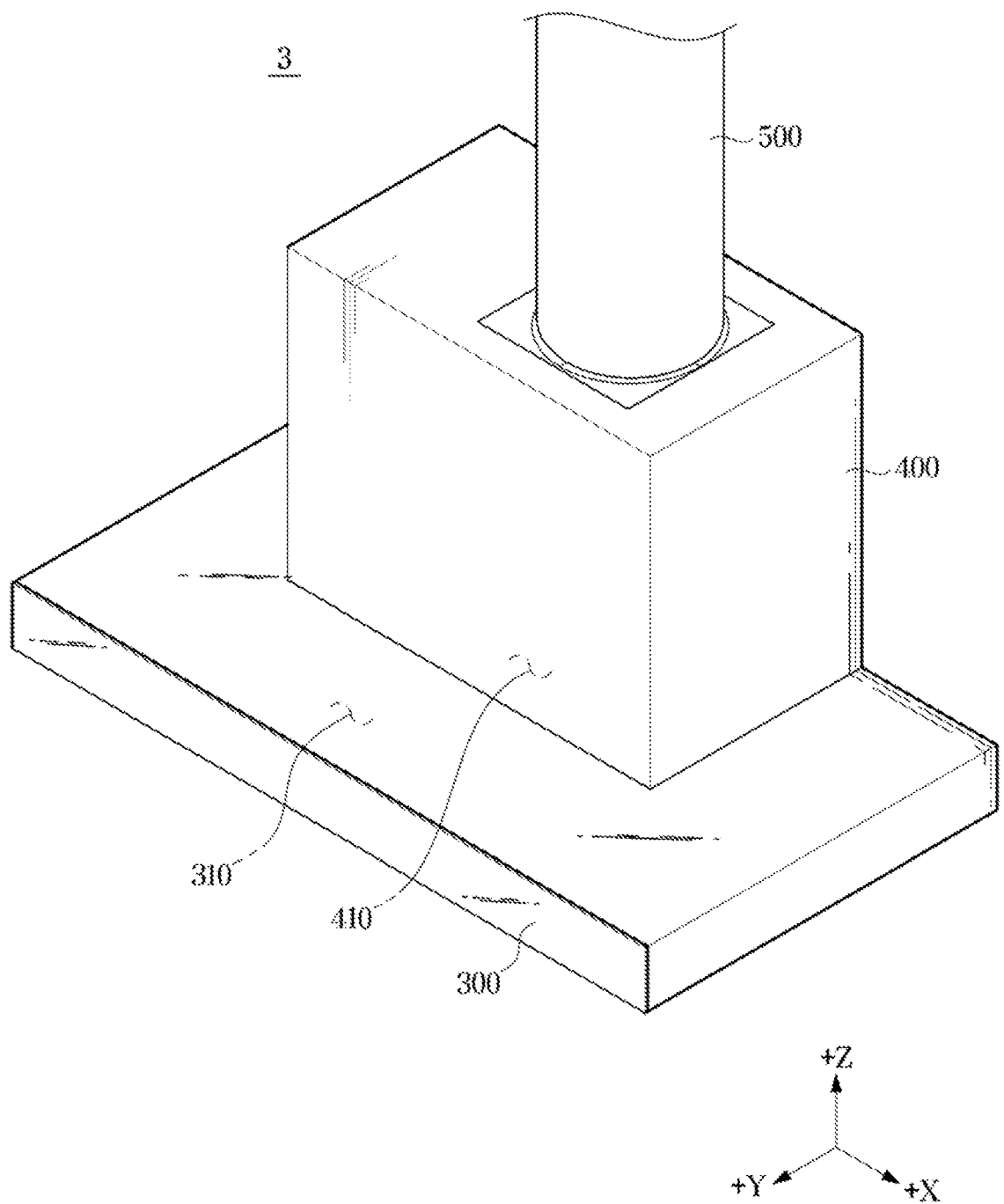
FIG. 12 shows an outer appearance of a hood according to an embodiment of the disclosure.

FIG. 10 is a perspective view of a refrigerator according to an embodiment of the disclosure, FIG. 11 shows an outer appearance of a dishwasher according to an embodiment of the disclosure, and FIG. 12 shows an outer appearance of a hood according to an embodiment of the disclosure.

In the following embodiments of the disclosure, directions defined by an X axis, a Y axis, and a Z axis are based on a home appliance, wherein a width direction of the home appliance is defined as an X-axis direction, a depth direction of the home appliance is defined as a Y-axis direction, and a height direction of the home appliance is defined as a Z-axis direction.

FIG. 10 shows an outer appearance of a refrigerator according to an embodiment of the disclosure, and a home appliance according to an embodiment of the disclosure may include an outer body using the decoration panel for home appliances.

Referring to FIG. 10, a refrigerator 1 may include a main body 10, a plurality of storage rooms 21, 22, and 23 formed inside the main body 10, a plurality of doors 31, 32, 33, and 34 opening and closing the storage rooms 21, 22, and 23, and a cool air supply device (not shown) for supplying cool air to the storage rooms 21, 22, and 23.

The main body 10 may include an inner case 11 forming the storage rooms 21, 22, and 23, an outer case 12 coupled with an outer side of the inner case 11 to form an outer appearance, and an insulation (not shown) provided between the inner case 11 and the outer case 12 to insulate the storage rooms 21, 22, and 23.

The storage rooms 21, 22, and 23 may be partitioned into a plurality of spaces by a horizontal partition wall 24 and a vertical partition wall 25. The storage rooms 21, 22, and 23 may be partitioned into an upper storage room 21, and a lower storage rooms 22 and 23 by the horizontal partition wall 24, and the lower storage rooms 22 and 23 may be partitioned into a left lower storage room 22 and a right lower storage room 23 by the vertical partition wall 25.

The upper storage room 21 may be used as a refrigerating room, and the lower storage rooms 22 and 23 may be used as freezing rooms. However, the above-described partitioning and use of the storage rooms 21, 22, and 23 may be only an example, and partitioning and use of the storage rooms 21, 22, and 23 are not limited to the above-described example.

Inside the storage rooms 21, 22, and 23, a shelf 26 on which food is put, and a storage container 27 for storing food may be provided.

The cool air supply device may generate cool air by using a cooling circulation cycle of compressing, condensing, expanding, and evaporating a refrigerant, and supply the generated cool air to the storage rooms 21, 22, and 23.

The storage room 21 may be opened and closed by a pair of doors 31 and 32. The doors 31 and 32 may be rotatably coupled with the main body 10. The storage room 22 may be opened and closed by the door 33, and the door 33 may be rotatably coupled with the main body 10. The storage room 23 may be opened and closed by the door 34, and the door 34 may be rotatably coupled with the main body 10. On the main body 10, a plurality of hinges 35, 36, and 37 may be provided to rotatably couple the doors 31, 32, 33, and 34 with the main body 10.

On rear surfaces of the doors 31, 32, 33, and 34, a door guide 38 for storing food and a door gasket 39 to be in close contact with a front surface of the main body 10 to seal the storage rooms 21, 22, and 23 may be provided.

On at least one portion of the outer case 12 of the main body 10, an aluminum decoration panel may be installed. The aluminum decoration panel may include: an aluminum substrate having one surface in which an engraved pattern having a preset width and a preset depth is formed, wherein micro unevenness is formed in a surface of the engraved pattern; a porous aluminum oxide layer formed in the engraved pattern; and a sealing layer formed to close pores of the porous aluminum oxide layer. The engraved pattern of the aluminum decoration panel may have a width ranging from 3.0 mm to 10.0 mm, a depth ranging from 75 μm to 850 μm, and a gradient ranging from 120° to 170°. An edge of the aluminum substrate may have a C shape or an R shape, wherein the C shape may range from 0.5 C to 2.0 C, and the R shape may range from 0.5 R to 2.0 R. "0.5 R to 2.0 R" means a radius of curvature with a radius of 0.5 mm to 2 mm, and "0.50 to 2.00" means a 45° chamfer with a side length of 0.5 mm to 2 mm. The porous aluminum oxide layer may have a thickness ranging from 5.0 μm to 30.0 μm, and a pore size ranging from 10 nm to 100 nm, wherein a dye may be filled in the pores. The aluminum decoration panel may be the above-described decoration panel for home appliances, and therefore, detailed descriptions thereof will be omitted.

Also, the aluminum decoration panel may be installed on outer sides of the doors 31, 32, 33, and 34. The aluminum decoration panel may be the above-described decoration panel for home appliances, and therefore, detailed descriptions thereof will be omitted.

FIG. 11 shows an outer appearance of a dishwasher according to an embodiment of the disclosure.

Referring to FIG. 11, a dishwasher 2 may include a main body 20 forming an outer appearance, and a door 200 rotatably coupled with the main body 20.

Inside the main body 20, a washing room (not shown) accommodating dishes may be provided. The dishwasher 2 may include various kinds of components including a plurality of nozzles for washing dishes accommodated in the washing room, a driver for driving the plurality of nozzles, a controller for controlling the driver, etc. The door 200 may open and close the washing room provided inside the main body 20.

The door 200 may include a door panel 210 and a door body 220, and the door panel 210 may be detachably coupled with the door body 220. As shown in FIG. 11, the door panel 210 may form a front surface of the door 200, and the door body 220 may form a rear surface of the door 200. The front surface of the door 200 may be a surface that is shown to a user in a closed state of the door 200, and the rear surface of the door 200 may be a surface facing inside of the main body 20 in the closed state of the door 200.

FIG. 12 shows an outer appearance of a hood according to an embodiment of the disclosure.

Referring to FIG. 12, a hood 3 according to an embodiment of the disclosure may include a main body including a first case 300 and a second case 400, and a fan module (not shown).

The first case 300 may include an inlet which smoke, etc. generated from a heating device enter. The inlet may be provided in a bottom of the first case 300. In the inlet, a filter may be installed to correspond to the inlet. The filter may be installed in the first case 300 to cover the inlet. The filter may filter foreign materials included in smoke, etc. entering the inlet.

The first case 300 may be provided substantially in a shape of a rectangular parallelepiped. Inside the first case 300, a flow path 310 may be formed. The flow path 310 may guide air passed through the filter and the inlet to the second case 400. The flow path 310 may be an inside space of the first case 300, a space separately partitioned inside the first case 300, or a duct installed inside the first case 300.

The second case 400 may be positioned above the first case 300. Inside the second case 400, the fan module may be positioned. Like the first case 300, the second case 300 may be provided substantially in a shape of a rectangular parallelepiped. The second case 400 may have a bottom and top having a smaller area than those of the first case 300, and have a greater height than the first case 300. The second case 400 may be manufactured separately from the first case 300, and then coupled with the first case 300. However, the second case 400 may be integrated into the first case 300. Also, the second case 400 may be integrated into the first case 300 by extending the top of the first case 300 upward in such a way as to be inclined with respect to a Z-axis direction.

Inside the second case 400, a flow path 410 may be formed. The flow path 410 may be connected to the flow path 310 of the first case 300. Air entered through the inlet may pass through the flow path 310 of the first case 300 and the flow path 410 of the second case 400 and then be discharged to outside through an exhaust pipe 500. The fan module may be provided inside the flow path 410. The flow path 410 may be an inside space of the second case 400, a space separately partitioned inside the second case 400, or a duct installed inside the second case 400.

All of the home appliances 1, 2, and 3 according to the above-described examples may include panels forming the outer sides of the main bodies 10, 20, 300, and 400. However, the decoration panel 100 may be used without limitation as long as the decoration panel 100 forms an outer side of a home appliance and is positioned at a location that is shown to users.

Also, the decoration panel 100 may be not necessarily used as panels of the main bodies 10, 20, 300, and 400. The home appliances 1 and 2 including the doors 31, 32, 33, 34, and 200 for opening and closing the inside spaces of the main bodies 10 and 20 may include door panels forming outer sides of the doors 31, 32, 33, 34, and 200. That is, in closed states of the doors 31, 32, 33, 34, and 200, the door panels may be shown to users. While the home appliances 1 and 2 are not used, the doors 31, 32, 33, 34, and 200 may be closed, and to use the home appliances 1, 2, and 3, a user may come close to the doors 32, 200, 300, and 400 and need to open the doors 32, 200, 300, and 400.

The panels of the main bodies 10, 20, 300, and 400 and/or the door panels 110, 210, 310, and 410 may be ones of components that have a great influence on a user's aesthetic satisfaction, durability, and usability.

A factor for improving a users aesthetic satisfaction without influencing functions of the main bodies 10, 20, 300, and 400 and/or the doors 31, 32, 33, 34, and 200 may be metallic texture of a main body panel and/or a door panel. By increasing metallic texture of a panel and preventing discoloration, a user's aesthetic satisfaction on the home appliances 1, 2, and 3 may be improved.

Also, a factor for improving durability of the main bodies 10, 20, 300, and 400 and/or the doors 31, 32, 33, 34, and 200 may be surface hardness of a main body panel and/or a door panel. By raising surface hardness of a panel, resistance against scratches or dents of the outer sides of the home appliances 1, 2, and 3, which may be made in a user's environment, may be improved.

Furthermore, in a case in which contamination of the main panel and/or the door panel is easily removed in regard to various contamination conditions that may occur in a user environment, easy cleaning of the main bodies 10, 20, 300, and 400 and/or the doors 31, 32, 33, 34, and 200 may be improved.

For this, the decoration panel 100 (see FIG. 1) according to the above-described embodiment of the disclosure may be used as the main body panel and/or door panel of the home appliances 1, 2, and 3.

Meanwhile, the above-described home appliances may be only examples of a home appliance according to an embodiment of the disclosure. Accordingly, any home appliance including the above-described decoration panel 100, as well as the above-described home appliances, may be included in an embodiment of the disclosure.

Hereinafter, for easy understanding of the disclosure, examples and a comparative example will be described. However, the following description is only examples related to content and effects of the disclosure, and the scope of right and effects of the disclosure are not limited to the following description.

EXAMPLES

Example 1: Manufacturing an Aluminum Decoration Panel Having an Engraved Pattern with a Width of 3.0 mm An aluminum substrate in which an engraved pattern having a width of 3.0 mm, a depth of 75 μm, and a gradient of 170° is formed was manufactured by performing extrusion molding and CNC machining with an aluminum material of Al 5000 series, and then, edges of the aluminum substrate were CNC-machined to a R shape.

Successively, the aluminum substrate in which the engraved pattern is formed was etched with an etching agent made by dissolving sodium nitrate ($NaNO_3$) of 1.0 wt % to 5.0 wt % in distilled water and adding hydrogen peroxide of 3.0 wt % to 7.0 wt % at 50° C. to 60° C. for 0.5 minutes to 10 minutes, and then, a sand blasting process was performed to form micro unevenness in a surface of the engraved pattern.

An anodizing process was performed on the substrate in which the micro unevenness is formed with a voltage of 13 V to 17 V at 18° C. to 23° C. Thereafter, a sealing process was performed at 80° C. to 90° C. for 10 minutes by using nickel acetate powder of 3 wt % to 4 wt %, thereby finally manufacturing three kinds of aluminum decoration panel samples having an engraved pattern with a width of 3.0 mm.

Example 2: Manufacturing an Aluminum Decoration Panel Having an Engraved Pattern with a Width of 5.0 mm An aluminum substrate in which an engraved pattern having a width of 5.0 mm, a depth of 215 μm, and a gradient of 158° is formed was manufactured by performing extrusion molding and CNC machining with an aluminum material of Al 5000 series.

Successively, the aluminum substrate in which the engraved pattern is formed was etched with an etching agent made by dissolving sodium nitrate ($NaNO_3$) of 1.0 wt % to 5.0 wt % in distilled water and adding hydrogen peroxide of 3.0 wt % to 7.0 wt % at 50° C. to 60° C. for 0.5 minutes to 10 minutes, and then, a sand blasting process was performed to form micro unevenness in a surface of the engraved pattern.

Figure 7A:
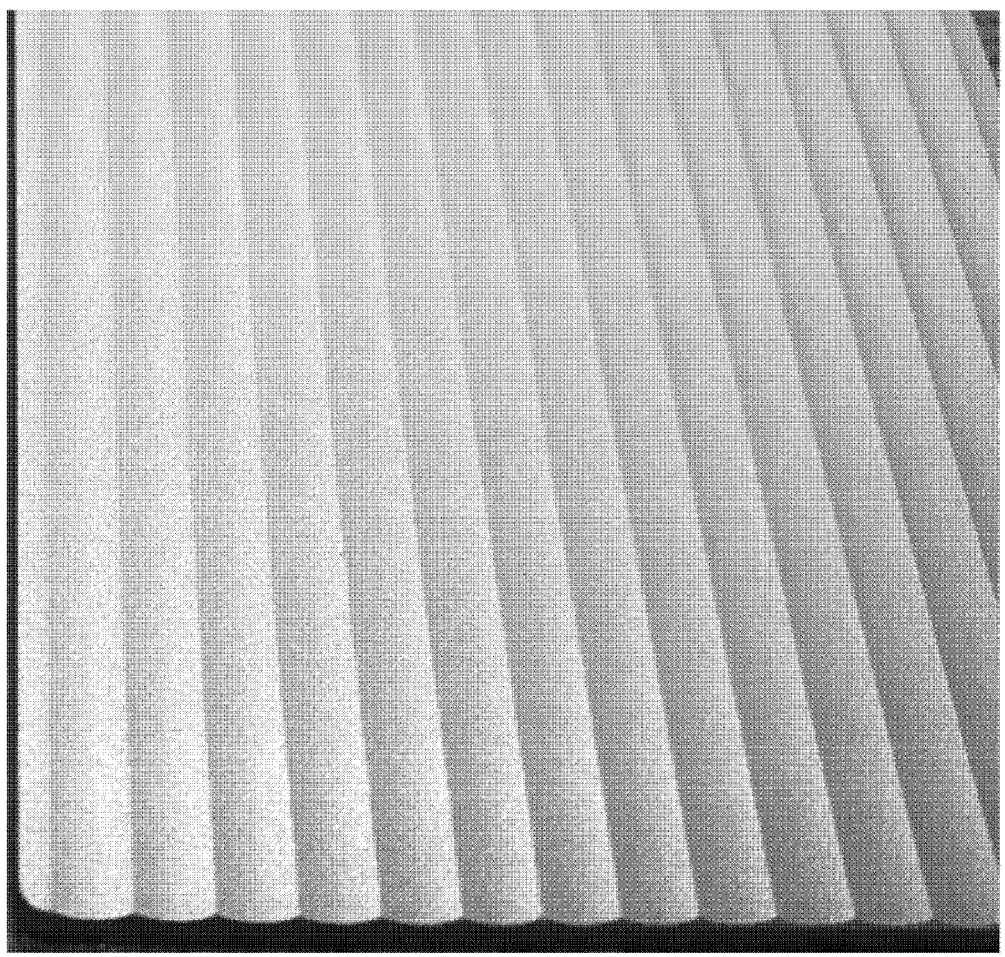
FIG. 7A is a picture of an aluminum decoration panel of Embodiment 2 in which an engraved pattern is formed.

An anodizing process was performed on the substrate in which the micro unevenness is formed with a voltage of 13 V to 17 V at 18° C. to 23° C. Thereafter, a sealing process was performed at 80° C. to 90° C. for 10 minutes by using nickel acetate powder of 3 wt % to 4 wt %, thereby finally manufacturing three kinds of aluminum decoration panel samples having an engraved pattern with a width of 5.0 mm (see FIG. 7A).

Example 3: Manufacturing an Aluminum Decoration Panel Having an Engraved Pattern with a Width of 8.0 mm An aluminum substrate in which an engraved pattern having a width of 8.0 mm, a depth of 543 μm, and a gradient of 137° is formed was manufactured by performing extrusion molding and CNC machining with an aluminum material of Al 5000 series.

Successively, the aluminum substrate in which the engraved pattern is formed was etched with an etching agent made by dissolving sodium nitrate ($NaNO_3$) of 1.0 wt % to 5.0 wt % in distilled water and adding hydrogen peroxide of 3.0 wt % to 7.0 wt % at 50° C. to 60° C. for 0.5 minutes to 10 minutes, and then, a sand blasting process was performed to form micro unevenness in a surface of the engraved pattern.

An anodizing process was performed on the substrate in which the micro unevenness is formed with a voltage of 13 V to 17 V at 18° C. to 23° C. Thereafter, a sealing process was performed at 80° C. to 90° C. for 10 minutes by using nickel acetate powder of 3 wt % to 4 wt %, thereby finally manufacturing three kinds of aluminum decoration panel samples having an engraved pattern with a width of 8.0 mm.

Comparative Example 1: Manufacturing a Flat Aluminum Decoration Panel

Figure 7B:
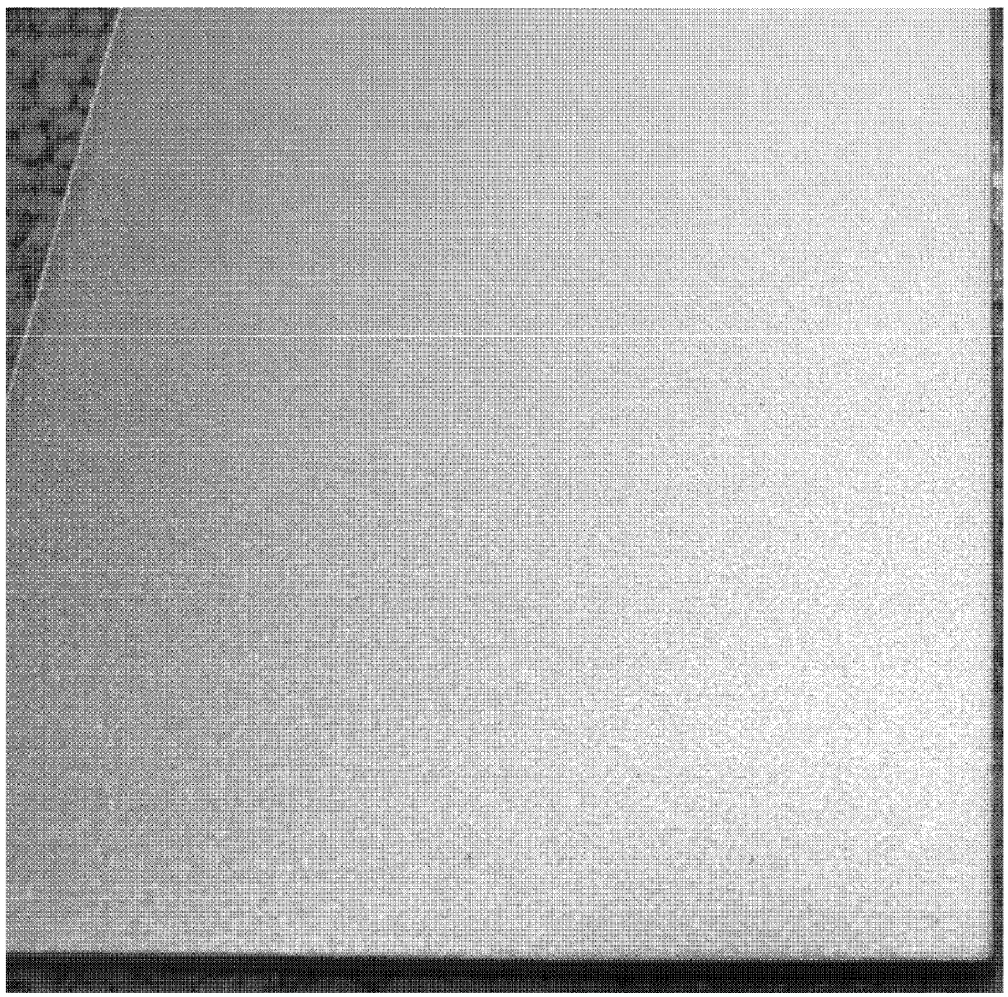
FIG. 7B is a picture of a flat aluminum decoration panel according to Comparative Example 1.

A sand blasting process was performed on an aluminum substrate of Al 5000 series without forming any engraved pattern, and then, an anodizing process was performed under a condition of a voltage range of 13 V to 17 V and a temperature range of 18° C. to 23° C. Thereafter, a sealing process was performed at 80° C. to 90° C. for 10 minutes by using nickel acetate powder of 3 wt % to 4 wt %, thereby manufacturing three kinds of flat aluminum decoration panel samples (see FIG. 7B).

Experimental Example 1: Evaluation of Reflectivity (Brightness)

To evaluate reflectivity of the aluminum decoration panels according patterns (see FIGS. 7A and 7B) manufactured in the examples and comparative example, glossiness was measured at 60°, and also, results obtained by relatively comparing degrees of gloss observed with the naked eye are shown in Table 2, below.

TABLE 2

| Sample | Example 1 Engraved Pattern With Width of 3.0 mm | | Example 2 Engraved Pattern With Width of 5.0 mm | | Example 3 Engraved Pattern With Width of 8.0 mm | | Comparative Example 1 Flat Surface (No Engraved Pattern) | |
|---|---|---|---|---|---|---|---|---|
| | Glossiness (60°) | Visual Evaluation | Glossiness (60°) | Visual Evaluation | Glossiness (60°) | Visual Evaluation | Glossiness (60°) | Visual Evaluation |
| #1 | 20.2 GU | Superior | 19.6 GU | Superior | 19.9 GU | Superior | 18.5 GU | Inferior |
| #2 | 20.0 GU | Superior | 19.3 GU | Superior | 20.1 GU | Superior | 18.2 GU | Inferior |
| #3 | 20.1 GU | Superior | 19.6 GU | Superior | 20.1 GU | Superior | 17.8 GU | Inferior |
| Mean | 20.1 GU | — | 19.5 GU | — | 20.0 GU | — | 18.2 GU | — |
| Standard Deviation | 0.10 GU | — | 0.17 GU | — | 0.12 GU | — | 0.4 GU | — |

Referring to Table 2, it was confirmed that the aluminum decoration panels having the engraved patterns according to Examples 1 to 3 have high reflectivity based on glossiness measurement and visual evaluation. Therefore, it is determined that, in the case in which an engraved pattern is formed, reflected light reflected after the light enters from the front has high linear density, as shown in FIG. 6A, and accordingly, reflectivity actually observed with the naked eye is significantly excellent compared to that of the case in which incident light and reflected light are on the same plane, as shown in FIG. 6B.

Figure 8A:
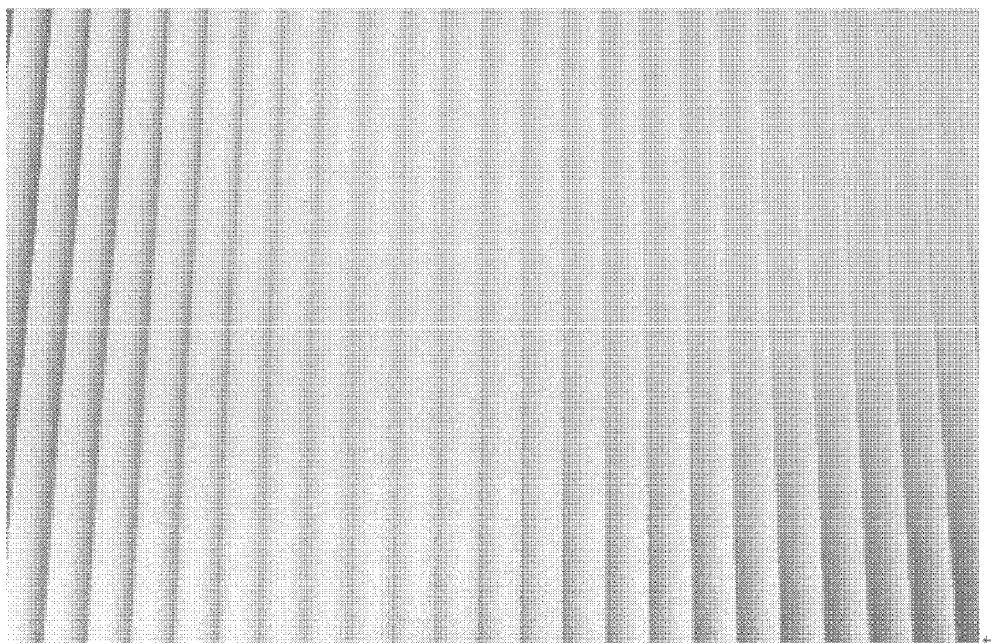
FIG. 8A is a picture of an aluminum decoration panel of Embodiment 2 in which an engraved pattern is formed, as photographed from the front.
Figure 8B:
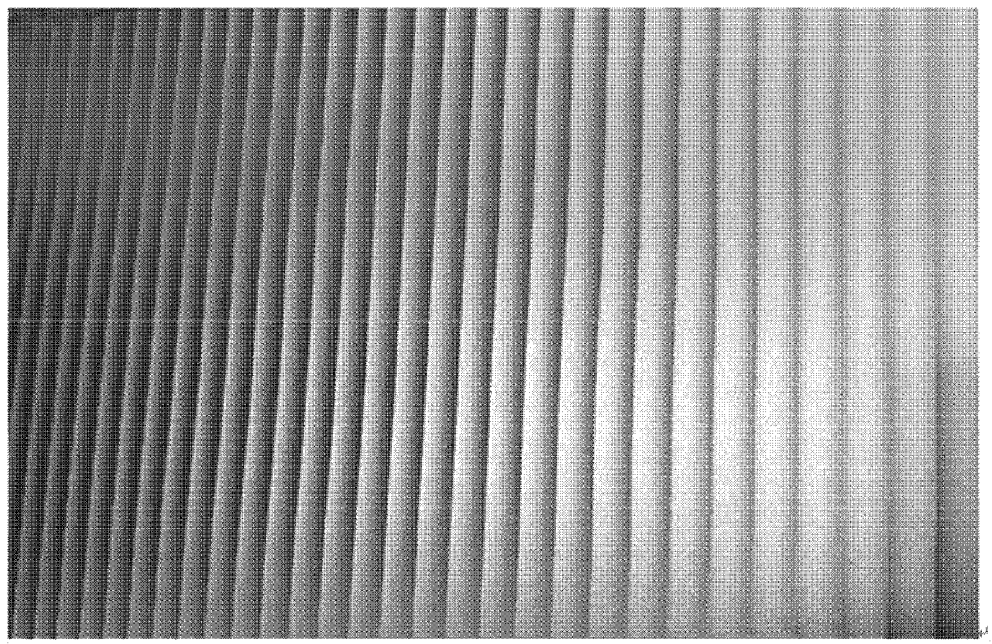
FIG. 8B is a picture of an aluminum decoration panel of Embodiment 2 in which an engraved pattern is formed, as photographed from the side.

FIGS. 8A and 8B are pictures obtained by photographing the aluminum panel manufactured according to Example 2 from the front and side. It was confirmed that shadows are formed by ridges of the engraved pattern according to viewing angles upon observation of the panel from the front with the naked eye to show a sense of three-dimensions, and various colors are expressed due to differences between amounts of reflection of light according to viewing angles even with respect to the same sample.

In a case in which the decoration panel in which the engraved pattern is formed is seen from the front, shadows may be formed by ridges of the engraved pattern to improve a sense of three-dimensions, and differences between amounts of reflection of light may be made according to angles at which a user sees the decoration panel to thereby express various colors.

Experimental Example 2: Evaluation of Durability (1) Evaluation of Scratch Resistance To evaluate scratch resistance, a scratch test was performed on the surface of the engraved pattern of the aluminum decoration panel sample according to Example 2 with various kinds of tools, and then, scratches were checked. A case in which no scratches are observed with the naked eye was determined to be excellent, and a case in which scratches are observed with the naked eye was determined to be poor. Results of the scratch resistance test are shown in Table 3, below.

TABLE 3

| Kind of Tools | 5 Round Trips | 10 Round Trips | 20 Round Trips |
|---|---|---|---|
| Nail | Excellent | Excellent | Excellent |
| Brass Wire Brush | Excellent | Excellent | Excellent |
| Drink Can | Excellent | Excellent | Excellent |
| Key | Excellent | Excellent | Excellent |
| Scrubbing Pad | Excellent | Excellent | Excellent |

TABLE 3-continued

| Kind of Tools | 5 Round Trips | 10 Round Trips | 20 Round Trips |
|---|---|---|---|
| Stainless Container | Excellent | Excellent | Excellent |

(2) Evaluation of Dent Resistance

To evaluate dent resistance, dents were checked by dropping steel balls having various weights at a height of 30 cm. In Comparative Example 2, an existing flat stainless substrate was used. A case in which no dents are observed with the naked eye was determined to be excellent, and a case in which dents are observed with the naked eye was determined to be poor. Results of the dent resistance test are shown in Table 4, below.

TABLE 4

| | Steel Ball 198.4 g | Steel Ball 254.8 g | Steel Ball 534 g |
|---|---|---|---|
| Example 2 | Excellent | Excellent | Excellent |
| Comparative Example 2 | Poor | Poor | Poor |

(3) Evaluation of Easy Cleaning

To evaluate easy cleaning, whether contamination removal of the aluminum decoration panel sample according to Example 2 is possible was checked under various kinds of contamination conditions shown in Table 5. More specifically, in the case of an oil-based ballpoint as a contamination condition that may be caused in daily life, a test of making 10 marks with the ballpoint, leaving the marks at room temperature for 24 hours, and then removing the marks was performed, and in the case of food and cosmetics, a test of applying food and cosmetics of 3 g, leaving the food and cosmetics at room temperature for 24 hours, and then removing the food and cosmetics was performed. Results of the easy cleaning test are shown in Table 5 according to the following evaluation standard.

<Evaluation Standard>
⊚: contamination was completely removed with water
○: contamination was completely removed with a cleaning agent or alcohol
X: contamination was not removed

| Classification | Kind | Result |
| --- | --- | --- |
| Oil-based Ballpoint | Red Ballpoint | ○ |
| | Blue Ballpoint | ○ |
| | Black Ballpoint | ○ |
| Food | Ketchup | ⊚ |
| | Soy Source | ⊚ |
| | Soybean Oil | ⊚ |
| Cosmetics | Foundation | ⊚ |
| | BB Cream | ⊚ |

(4) Evaluation of Discoloration Resistance

To evaluate discoloration resistance, a test of leaving the aluminum decoration panel sample according to Example 2 for 24 hours under a UV-C lamp with a height difference of 20 cm from the UV-C lamp was performed, and by measuring color coordinates before and after the test as SCI values, results of the measurement are shown in Table 6, below.

TABLE 6

| | Before | After |
| --- | --- | --- |
| L* | 88.48 | 88.91 |
| a* | −0.54 | −0.24 |
| b* | 2.72 | 1.87 |
| ΔE | — | 0.93 |

Figure 9A:
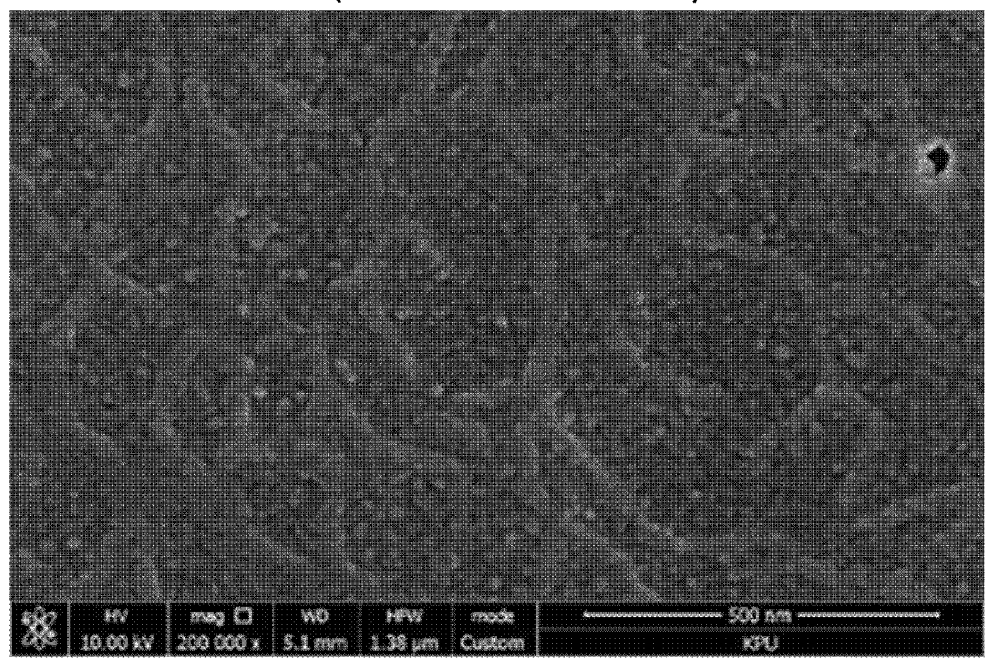
FIG. 9A is a surface Secondary Electron Microscope (SEM) picture of a decoration panel sealed by a method according to an embodiment of the disclosure.
Figure 9B:
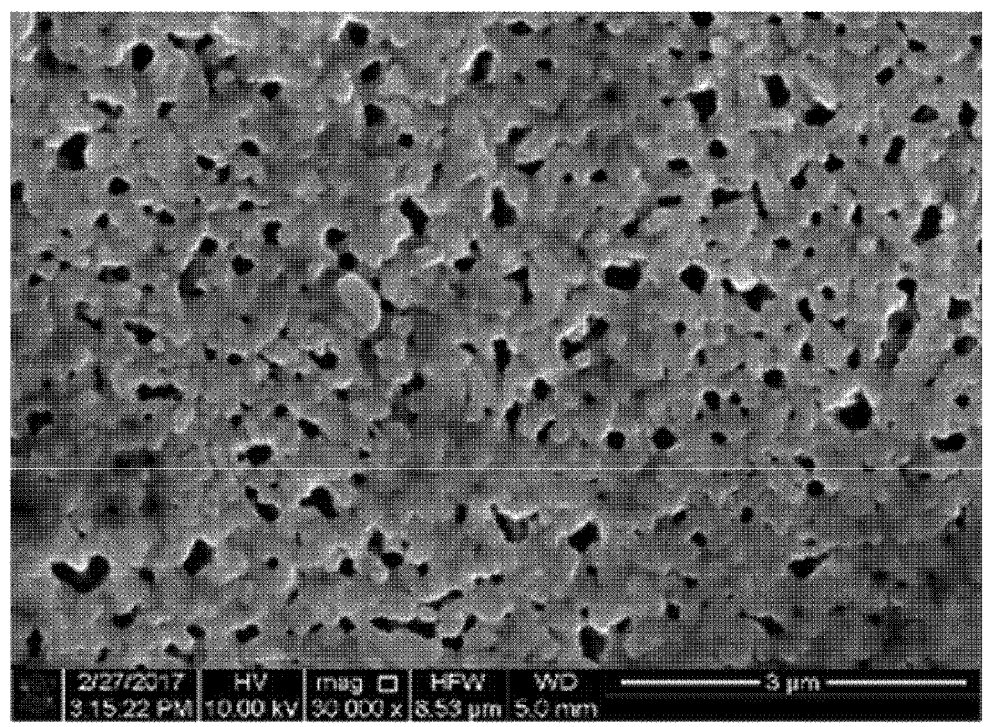
FIG. 9B is a surface SEM picture of a decoration panel insufficiently sealed.

Referring to Tables 3 to 6, it is confirmed from Experimental Example 2 that the decoration panel manufactured by the method according to the disclosure has excellent scratch resistance, dent resistance, easy cleaning, and discoloration resistance. The surface of the decoration panel manufactured by the method according to the disclosure may be, as seen in FIG. 9A, formed as a ceramic layer densely formed of aluminum oxide ($AL_2O_3$) particles by sealing, and accordingly, the decoration panel may have excellent surface hardness (pencil hardness of 9H). Therefore, as shown in Tables 3 and 4, scratches or dents that may be made in a user's life may be prevented. Furthermore, it is confirmed from Tables 5 and 6 that removal of foreign materials with respect to various contaminations is easy to show excellent easy cleaning, and a color difference ΔE between before and after ultraviolet irradiation is 1.0 or less to also show an effect of excellent anti-discoloration. Meanwhile, as shown in FIG. 9B, insufficient sealing may result in failing to obtain desired durability of the disclosure due to existence of a plurality of open pores.

Accordingly, the decoration panel for home appliances manufactured by the method according to the disclosure may have excellent reflectivity and design appearance compared to existing flat decoration panels, without performing a chemical polishing process or a high-gloss machine polishing (for example, buffing) process. Also, by performing sealing after anodizing, scratches, dents, and discoloration that may be made in a user environment may be prevented, and an excellent surface that is easily cleaned may be obtained.

According to the disclosure, there may be provided a decoration panel for home appliances capable of increasing metallic texture being inherent in aluminum by primarily forming an engraved pattern by extrusion or machining and secondarily implementing micro unevenness in the engraved pattern by using one or more of chemical etching and/or sand blasting to provide an effect of dispersing incident light to various angles and achieve high reflectivity compared to flat materials, and a method for manufacturing the decoration panel. Also, there may be provided a decoration panel for home appliances capable of applying an anodizing process to raise surface hardness and thereby improving resistance against scratches or dents, while preventing discoloration and improving easy cleaning with respect to foreign materials.

However, effects that may be achieved by a method of treating a surface formed of an aluminum material, according to the embodiments of the disclosure, are not limited to the above-mentioned effects, and other effects not mentioned will be clearly understood by one of ordinary skill in the technical field to which the disclosure belongs from the above descriptions.

Although specific embodiments of the disclosure have been described, the disclosure is not limited to the above-described specific embodiments, and it is obvious that various modifications can be made by persons of ordinary skill in the technical art to which the disclosure belongs without deviating from the gist of the disclosure set forth in the claims, and the modifications surely reside in the scope of the claims.

What is claimed is:

1. A decoration panel for home appliances, comprising:
an aluminum substrate having one surface with an engraved pattern, the engraved pattern having:
a preset width from a first end of one of the engraved patterns to a second end of the one of the engraved patterns,
a preset depth from the one surface to a deepest part of the engraved pattern, the engraved pattern having the preset width from the first end to the second end having repeated curved adjacent preset widths of first ends and second ends connected to each other without having a flat portion between the first end and the second ends, wherein the preset width of the engraved pattern ranges from 3.0 mm to 10.0 mm, and when the preset width of the engraved pattern is 3 mm to 6 mm, a ratio of the preset depth (μm) to the preset width (mm) is 25 or more, and when the preset width of the engraved pattern is 7 mm to 10 mm, a ratio of the preset depth (μm) to the preset width (mm) is 59 or more; and
micro unevenness formed in a surface of the engraved pattern;
a porous aluminum oxide layer having a plurality of pores, and formed on the engraved pattern; and
a sealing layer formed to close the plurality of pores of the porous aluminum oxide layer,
wherein an edge of the aluminum substrate is in a Chamfering (C) shape or a Rounding (R) shape.

2. The decoration panel of claim 1, wherein the preset depth of the engraved pattern ranges from 75 μm to 860 μm.

3. The decoration panel of claim 1, wherein a gradient of the engraved pattern which is a degree of inclination based on the preset width of the engraved pattern and the preset depth of the engraved pattern, ranges from 120° to 170°.

4. The decoration panel of claim 1, wherein the edge of the aluminum substrate is formed in the C shape ranging from 0.5 C to 2.0 C which defines a 45° chamfer with a side length of 0.5 mm to 2 mm and the first end is adjacent to the Chamfering shaped edge or in a Rounding (R) shape ranging from 0.5 R to 2.0 R which defines a radius of curvature with a radius of 0.5 mm to 2 mm, and the first end is adjacent to the Rounding shaped edge for the edge of the aluminum substrate formed in R shape.

5. The decoration panel of claim 1, wherein a thickness of the porous aluminum oxide layer ranges from 5.0 μm to 30.0 μm.

6. The decoration panel of claim 1, wherein each pore of the porous aluminum oxide layer is formed with a size ranging from 10 nm to 100 nm.

7. The decoration panel of claim 1, wherein the porous aluminum oxide layer further comprises a dye filled in the plurality of pores.

8. The decoration panel of claim 1, wherein the sealing layer is formed of a plurality of aluminum oxide particles.

9. A method for manufacturing a decoration panel, comprising:
preparing an aluminum substrate;
forming an engraved pattern in one surface of the aluminum substrate, the engraved pattern having:
a preset width from a first end of one of the engraved patterns to a second end of the one of the engraved patterns;
a preset depth from the one surface to a deepest part of the engraved pattern, the engraved pattern having the preset width from the first end to the second end having repeated curved adjacent preset widths of first ends and second ends connected to each other without having a flat portion between the first ends and the second ends, wherein the preset width of the engraved pattern ranges from 3.0 mm to 10.0 mm, and when the preset width of the engraved pattern is 3 mm to 6 mm, a ratio of the preset depth (μm) to the preset width (mm) is 25 or more, and when the preset width of the engraved pattern is 7 mm to 10 mm, a ratio of the preset depth (μm) to the preset width (mm) is 59 or more;
forming micro unevenness in a surface of the engraved pattern;
performing anodizing on the surface of the aluminum substrate in which the micro unevenness is formed to form a porous aluminum oxide layer having a plurality of pores;
performing sealing to close the plurality of pores of the porous aluminum oxide layer; and
machining an edge of the aluminum substrate to a Chamfering (C) shape or a Rounding (R) shape after the forming of the engraved pattern.

10. The method of claim 9, wherein the forming of the engraved pattern is performed through extrusion molding or Computer Numerical Control (CNC) machining.

11. The method of claim 9, wherein the forming of the micro unevenness is performed by at least one process selected from chemical etching and sand blasting, wherein the chemical etching is performed by using an etching solution selected from group including $NaNO_3$, $H_2O_2$, NaOH, and combinations thereof, and
the sand blasting is performed by using an abrasive selected from among stainless steel, ceramic, glass, and emery.

12. The method of claim 9, further comprising coloring with a dye for color implementation, before the performing of the sealing.

13. A home appliance comprising:
a main body; and
a door to open or close the main body;
at least one of the main body or the door comprises an aluminum decoration panel,
wherein the aluminum decoration panel comprises:
an aluminum substrate having one surface with an engraved pattern, the engraved pattern having:
a preset width from a first end of one of the engraved patterns to a second end of the one of the engraved patterns;
a preset depth from the one surface to a deepest part of the engraved pattern, the engraved pattern having the preset width from the first end to the second end having repeated curved adjacent preset widths of first ends and second ends connected to each other without having a flat portion between the first ends and the second ends, wherein the preset width of the engraved pattern ranges from 3.0 mm to 10.0 mm, and when the preset width of the engraved pattern is 3 mm to 6 mm, a ratio of the preset depth (μm) to the preset width (mm) is 25 or more, and when the preset width of the engraved pattern is 7 mm to 10 mm, a ratio of the preset depth (μm) to the preset width (mm) is 59 or more; and
micro unevenness formed in a surface of the engraved pattern;
a porous aluminum oxide layer having a plurality of pores, and formed on the engraved pattern; and
a sealing layer formed to close the plurality of pores of the porous aluminum oxide layer, wherein an edge of the aluminum substrate is in a Chamfering (C) shape or a Rounding (R) shape.

* * * * *

UNITED STATES PATENT AND TRADEMARK OFFICE
CERTIFICATE OF CORRECTION

PATENT NO. : 12,398,482 B2  
APPLICATION NO. : 17/880083  
DATED : August 26, 2025  
INVENTOR(S) : Kyunghwan Lee et al.

Page 1 of 1

It is certified that error appears in the above-identified patent and that said Letters Patent is hereby corrected as shown below:

In the Claims

Column 16, Line 41:  
In Claim 1, delete "patterns," and insert -- patterns; --.

Column 16, Line 47:  
In Claim 1, delete "end" and insert -- ends --.

Signed and Sealed this  
Eleventh Day of November, 2025

John A. Squires  
*Director of the United States Patent and Trademark Office*